(12) United States Patent
Sasaki

(10) Patent No.: US 8,090,494 B2
(45) Date of Patent: Jan. 3, 2012

(54) ELECTRONIC APPARATUS AND PROGRAM STORAGE MEDIUM

(75) Inventor: Keiji Sasaki, Toyohashi (JP)

(73) Assignee: Denso Corporation, Kariya (JP)

( * ) Notice: Subject to any disclaimer, the term of this patent is extended or adjusted under 35 U.S.C. 154(b) by 346 days.

(21) Appl. No.: 12/463,484

(22) Filed: May 11, 2009

(65) Prior Publication Data

US 2009/0281690 A1    Nov. 12, 2009

(30) Foreign Application Priority Data

May 12, 2008    (JP) .................................. 2008-124688

(51) Int. Cl.
*G06F 19/00* (2006.01)
(52) U.S. Cl. ............................... 701/30; 701/33; 701/35
(58) Field of Classification Search .................... 701/29, 701/30, 33, 35
See application file for complete search history.

(56) References Cited

U.S. PATENT DOCUMENTS

| | | | | |
|---|---|---|---|---|
| 5,353,430 | A * | 10/1994 | Lautzenheiser | 711/117 |
| 5,594,885 | A * | 1/1997 | Lautzenheiser | 711/133 |
| 6,243,630 | B1 | 6/2001 | Oohara et al. | |
| 6,246,933 | B1 * | 6/2001 | Bague | 701/35 |
| 6,278,913 | B1 * | 8/2001 | Jiang | 701/3 |
| 6,367,992 | B1 | 4/2002 | Aruga et al. | |
| 7,114,106 | B2 * | 9/2006 | Klotz et al. | 714/712 |
| 7,184,866 | B2 * | 2/2007 | Squires et al. | 701/33 |

FOREIGN PATENT DOCUMENTS

| | | |
|---|---|---|
| JP | 06-004410 | 1/1994 |
| JP | 2528990 | 12/1996 |
| JP | 11-149418 | 6/1999 |
| JP | 11-159387 | 6/1999 |
| JP | 11-328041 | 11/1999 |
| JP | 2000-195314 | 7/2000 |
| JP | 2002-041367 | 2/2002 |
| JP | 2004-232498 | 8/2004 |
| JP | 2006-293650 | 10/2006 |

OTHER PUBLICATIONS

Japanese Office Action dated Jan. 26, 2010 issued in corresponding Japanese Application No. 2008-124688, with English translation.
Japanese Office Action dated Aug. 3, 2010 issued in corresponding Japanese Application No. 2008-124688, with English translation.

* cited by examiner

*Primary Examiner* — Toan To
(74) *Attorney, Agent, or Firm* — Nixon & Vanderhye PC

(57) ABSTRACT

An electronic control unit executes a program to perform a failure diagnosis as well as a vehicle control. On boot-up, diagnosis associated data is read from a backup memory and written in a RAM. The diagnosis associated data represents a failure diagnosis result previously backed up in the backup memory. When performing a failure diagnosis, the diagnosis associated data in the RAM is updated if needed, and an update flag is turned ON at updating. The presence of the update is checked using the update flag. Each time the update flag turns ON, the update flag is turned OFF and a timer is set to zero. The timer starts to measure an elapsed time. When the timer value exceeds a threshold value, it is determined that a predetermined time elapsed since the diagnosis associated data was previously updated. The diagnosis associated data in the RAM is then backed up.

14 Claims, 13 Drawing Sheets

FIG. 2
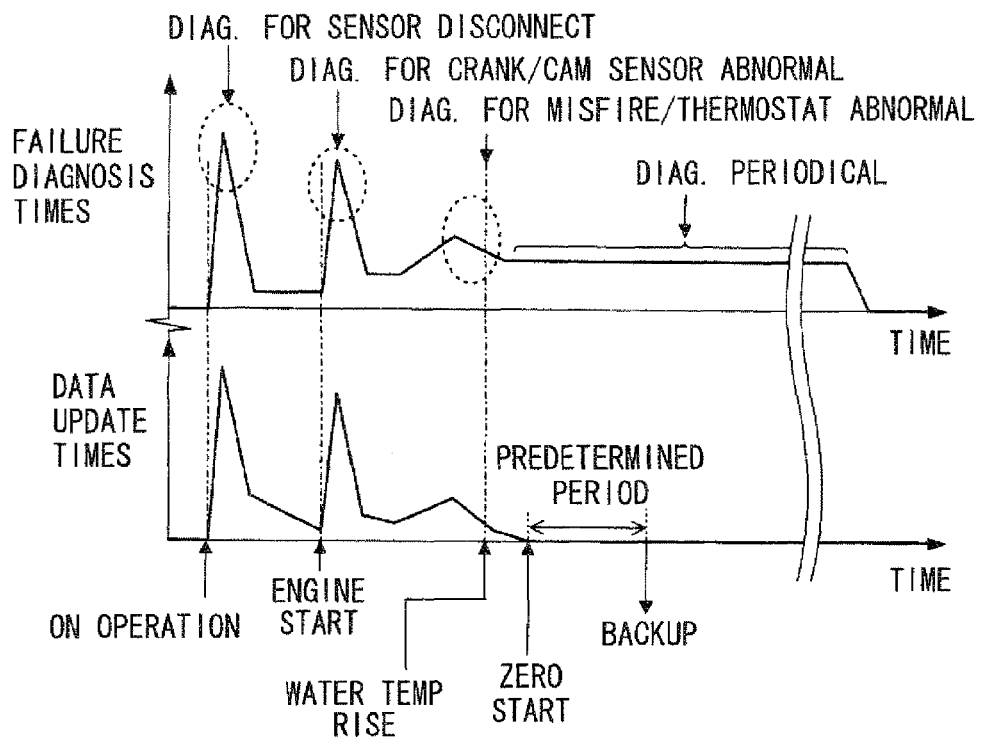
FIG. 3A
(DIAGNOSIS ASSOCIATED DATA)
| DIAG RESULT | NORMAL HISTORY | ABNORMAL HISTORY |
|---|---|---|
| NORMAL | PRESENT | ABSENT |
| NORMAL | PRESENT | ABSENT |
| NORMAL | PRESENT | ABSENT |
| ABNORMAL | PRESENT | PRESENT |
| NORMAL | PRESENT | ABSENT |
| ABNORMAL | PRESENT | PRESENT |
| NORMAL | PRESENT | ABSENT |
FIG. 3B
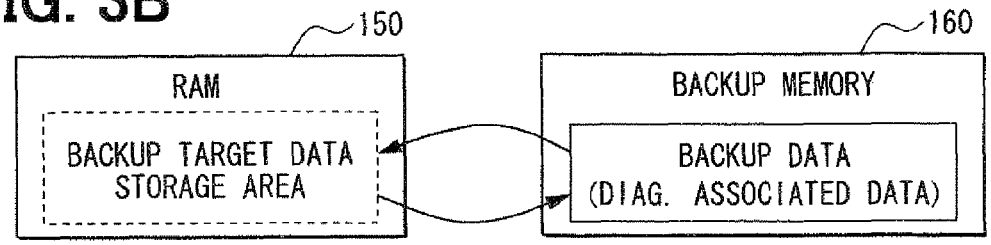

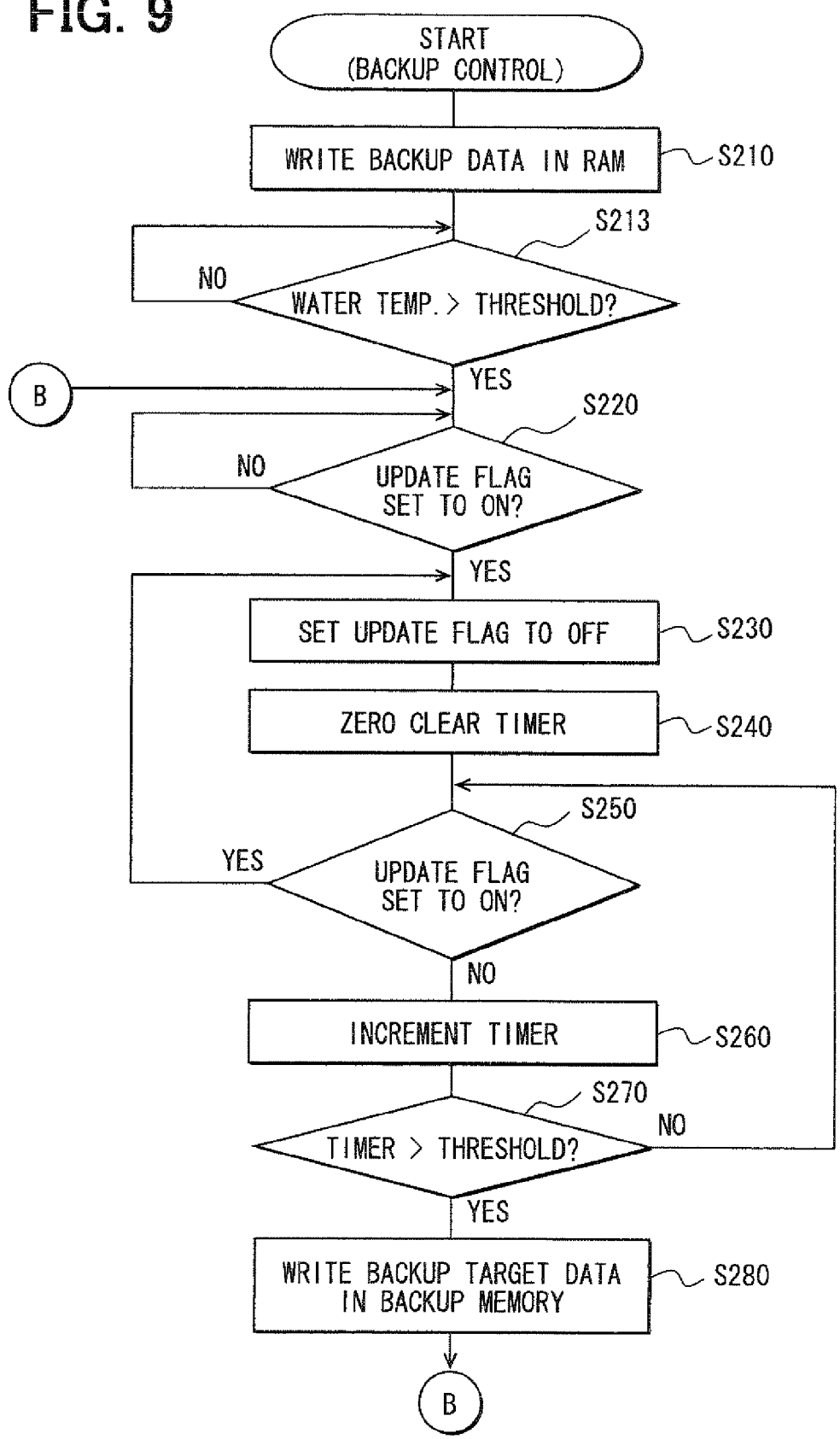

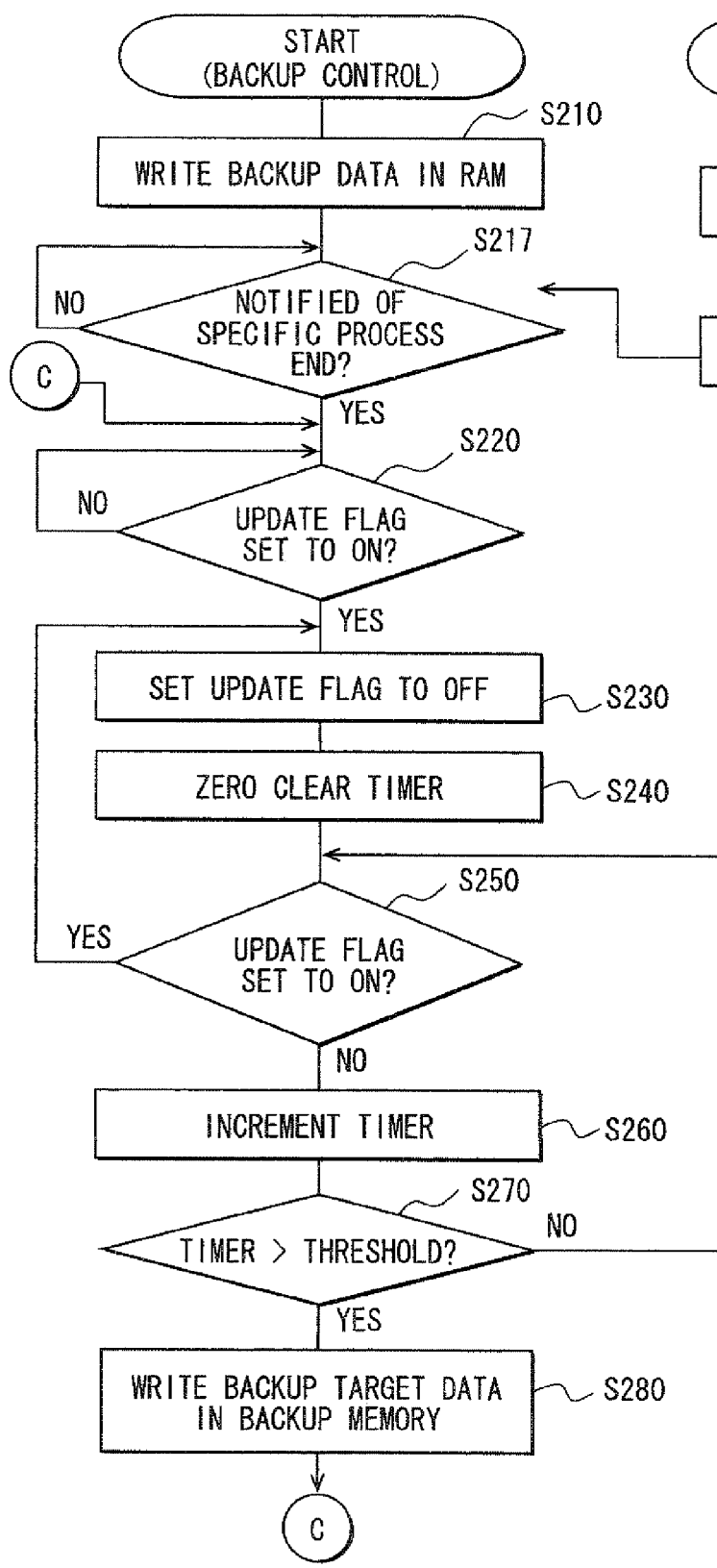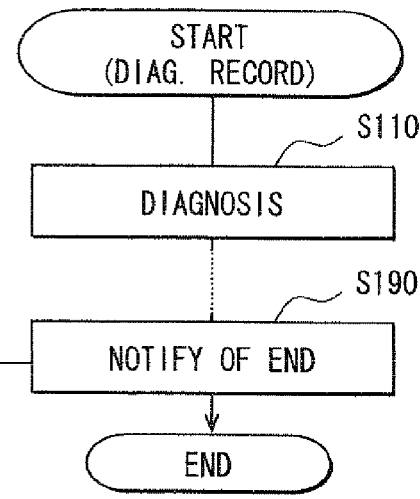

ELECTRONIC APPARATUS AND PROGRAM STORAGE MEDIUM

CROSS REFERENCE TO RELATED APPLICATION

This application is based on and incorporates herein by reference Japanese Patent Application No. 2008-124688 filed on May 12, 2008.

FIELD OF THE INVENTION

The present invention relates to an electronic apparatus having a function to back up data, which is written in a temporary storage memory, in a backup memory, and a program storage medium associated with the electronic apparatus.

BACKGROUND OF THE INVENTION

Patent document 1: JP-H10-252546 A (corresponding to U.S. Pat. No. 6,243,630)
Patent document 2: JP-2006-293650 A
Patent document 3: JP-H11-159387 A A known electronic apparatus writes failure information of vehicles, learnt values of control parameters used for vehicle controls, etc. in a backup memory to thereby hold them.

Further, such an electronic apparatus for a vehicle has as a backup memory a volatile memory (so-called SRAM), which stores and holds the data by being constantly supplied with an electric power of a battery even when an accessory switch or ignition switch is in an OFF state.

Further, a backup memory includes a nonvolatile electrically data rewritable memory such as a flash memory or EEPROM. Incidentally, in case that the electronic apparatus writes a copy of data, which is stored in the temporary storage memory, in the backup memory, thereby backing up the data, if data for a backup target is written in the backup memory each time the data is written in the temporary storage memory, the electronic apparatus increases the processing load in the backup operation.

In addition, the number of times of data writing of the nonvolatile memory such as a flash memory and EEPROM has a physical limitation. Thus, the technique to perform data backup frequently using such a nonvolatile memory causes the life of the electronic apparatus to become short.

Accordingly, the backup operation to write the copy of data, which is stored in the temporary storage memory, in the backup memory is typically performed just each time the electronic apparatus performs a predetermined quantity operation (see Patent document 1) or just before the electronic apparatus shuts down.

In addition, in a conventional electronic apparatus for a vehicle, the backup operation of the learnt value is performed on condition that the travel distance of the vehicle (refer to Patent document 2) or the amount of the change of the learnt value (refer to Patent document 3) comes to be more than a threshold value.

Herein, the technology to perform data backup just before shutting down the electronic apparatus requires a configuration in which the ON state of the electronic apparatus is maintained at least for a while after an operation to turn OFF and then is shut down.

For example, in the case of the electronic apparatus for a vehicle, when the turn-off operation of the ignition switch or accessory switch of the vehicle is carried out, it is necessary to execute the backup operation and stop the electronic apparatus thereafter, thus requiring a corresponding relay circuit.

Providing such a relay circuit increases the manufacturing cost of the electronic apparatus by the cost corresponding to the relay circuit. Thus, there is a problem that the technique of backing up the data just before shutting down of the electronic apparatus increases the manufacturing cost. In addition, in the electronic apparatus for a vehicle, there is a problem that it is difficult for an economy car to have such a relay circuit, and the backup operation using the relay circuit cannot be realized because of the cost.

In addition, in such a technique, when the electronic apparatus is unintentionally shut down without passing through the regular procedure because of the trouble etc., there is a problem that the data stored in the temporary storage memory up to that time cannot be backed up.

Further, in the technique of executing the backup operation each time the electronic apparatus performs a predetermined quantity operation, when the amount of operation as the execution condition of the backup operation is decreased, the above problem in the processing load or life of the apparatus occurs. When the above amount of operation is increased, a problem that the data, which fails in the backup, increases in number. Such a problem similarly occurs in the technique of executing backup operation on condition that the travel distance of the vehicle comes to be more than a threshold value.

In addition, in a conventional technology of executing backup operation on condition that the amount of change of the learnt value or travel distance of the vehicle comes to be more than a threshold value, when the target of the backup operation is a learnt value, the backup operation may be efficiently performed to some extent. However, when the failure information of the vehicle is backed up, the same result cannot be necessarily obtained.

With respect to the control parameter concerning the vehicle control, the travel distance of the vehicle becomes longer so that the execution of the learning process increases more. The difference of the newest learnt value and the past learnt value, which is already backed up, becomes large as the travel distance of the vehicle becomes long. In other words, no great difference occurs between the newest learnt value and the past learnt value in the short travel distance even if the backup operation is not performed. Thus, no big problem occurs.

In contrast, there is a high possibility that the failure of the vehicle is detected at the failure diagnosis executed at the time of the activation or start-up of the internal combustion engine. Furthermore, the failure may occur suddenly in the other period. The occurrence or phenomenon of the failure cannot be predicted easily.

That is, the failure information of the vehicle which should be backed up is irregularly generated without being related with the travel distance. On the other hand, the failure information of the vehicle need not be necessarily backed up unless the failure occurs. The failure information of the vehicle has a different character from that of the learnt value, which need to be backed up repeatedly during the travel of the vehicle. Furthermore, the update of the learnt value is executed in high frequency; in contrast, the probability of occurrence of the failure is dramatically low.

Therefore, when the backup operation about the failure information is executed using the same technique as the conventional technology concerning the backup of the learnt value mentioned above, the backup operation cannot be executed at an appropriate time point. That is, the conventional technology cannot efficiently perform the backup operation while decreasing a possibility of missing in the backup with respect to the backup of the data, which is generated regardless of the travel distance or the amount of the operation load of the apparatus, thus posing a problem.

SUMMARY OF THE INVENTION

It is an object of the present invention to provide a technology for achieving a more efficient backup operation.

According to an example of the present invention, an electronic apparatus is provided as follows. The electronic apparatus is provided with (i) a volatile temporary storage memory to store data temporarily, (ii) a process execution portion to execute a predetermined process and write data, which results from the executing, in the temporary storage memory, and (iii) a backup memory to store to hold backup data corresponding to the data written in the temporary storage memory, at least part of the data held in the temporary storage memory being predetermined as storage target data. The electronic apparatus comprises: a backup portion configured to write a copy of the storage target data in the backup memory as the backup data; and a measurement portion configured to measure a non-write time period which is an elapsed time that elapsed since data associated with the storage target data was previously written in the temporary storage memory. Herein, the backup portion is further configured to write the copy of the storage target data in the backup memory as the backup data when it is determined that the non-write time period reaches a predetermined threshold value based on a measurement result by the measurement portion.

As an example of the present invention, an electronic apparatus is provide as follows. The electronic apparatus comprises: a program storage section configured to store a program; a computer configured to execute a process according to the program stored in the program storage section; a volatile temporary storage memory configured to store data temporarily; and a backup memory configured to store to hold backup data corresponding to data written in the temporary storage memory. The computer is further configured to contain a timer which measures an elapsed time starting from a start-up, and a memory access monitor section configured to generate an interruption request when data write is executed to a predetermined monitor area. The program storage section is further configured to include a program causing the computer to achieve functions of the following portions: a process execution portion configured to execute a predetermined process and write data, which results from the executing, in the temporary storage memory; a setting portion configured to set, as the monitor area for the memory access monitor section, an area in the temporary storage memory, the area storing data which expresses an execution result obtained from an execution of the predetermined process and belongs to the storage target data; a timer control portion configured to start the timer when the interruption request is inputted from the memory access monitor section; and a backup portion configured to write a copy of the storage target data in the backup memory as the backup data when it is determined that the elapsed time reaches a threshold value based on a measurement result of the timer.

As an example of the present invention, a method is provided for data backup in an electronic apparatus. The electronic apparatus includes: a computer; a temporary storage memory being a volatile memory to temporarily store data written by the computer; and a backup memory configured to store to hold backup data corresponding to data written in the temporary storage memory. The method comprises: measuring an elapsed time that elapsed since data corresponding to predetermined storage target data was previously written in the temporary storage memory; and writing a copy of the storage target data, which is stored in the temporary storage memory, in the backup memory as backup data when the elapsed time reaches a predetermined threshold value.

As an example of the present invention, a computer readable program storage medium is provided as follows. The medium comprises instructions being executed by a computer, the instructions including the above method for the data backup, the method being computer-implemented.

As an example of the present invention, a method is provided for data backup in an electronic apparatus. The electronic apparatus includes: a computer; a temporary storage memory being a volatile memory to temporarily store data written by the computer; and a backup memory configured to store to hold backup data corresponding to data written in the temporary storage memory. The computer contains a timer which measures an elapsed time starting from a start-up, and a memory access monitor section configured to generate an interruption request when data write is executed to a predetermined monitor area. The method comprises: setting, as the monitor area for the memory access monitor section, an area of the temporary storage memory storing predetermined storage target data; starting the timer when the interruption request is inputted from the memory access monitor section; and writing a copy of the storage target data, which is stored in the temporary storage memory, in the backup memory as backup data when it is determined that the elapsed time reaches a predetermined threshold value based on a measurement result of the timer.

As an example of the present invention, a computer readable program storage medium is provided as follows. The medium comprises instructions being executed by a computer, the instructions including the just above method for the data backup, the method being computer-implemented.

BRIEF DESCRIPTION OF THE DRAWINGS

The above and other objects, features, and advantages of the present invention will become more apparent from the following detailed description made with reference to the accompanying drawings. In the drawings:

FIG. 2 is a graph illustrating executions of failure diagnoses and updates of diagnosis associated data;

FIG. 3A is a diagram illustrating a data configuration of the diagnosis associated data;

FIG. 3B is a diagram illustrating a management method of the diagnosis associated data;

FIG. 9 is a flowchart illustrating a backup control process according to a third embodiment of the present invention;

FIGS. 10A, 10B are flowcharts illustrating a backup control process and diagnosis record process according to a fourth embodiment of the present invention;

DETAILED DESCRIPTION OF THE PREFERRED EMBODIMENTS

Hereafter, description will be given to embodiments of the present invention with reference to the drawings. However, the present invention is not limited to embodiments described below, and can be modified in the various manners.

First Embodiment

Figure 1:
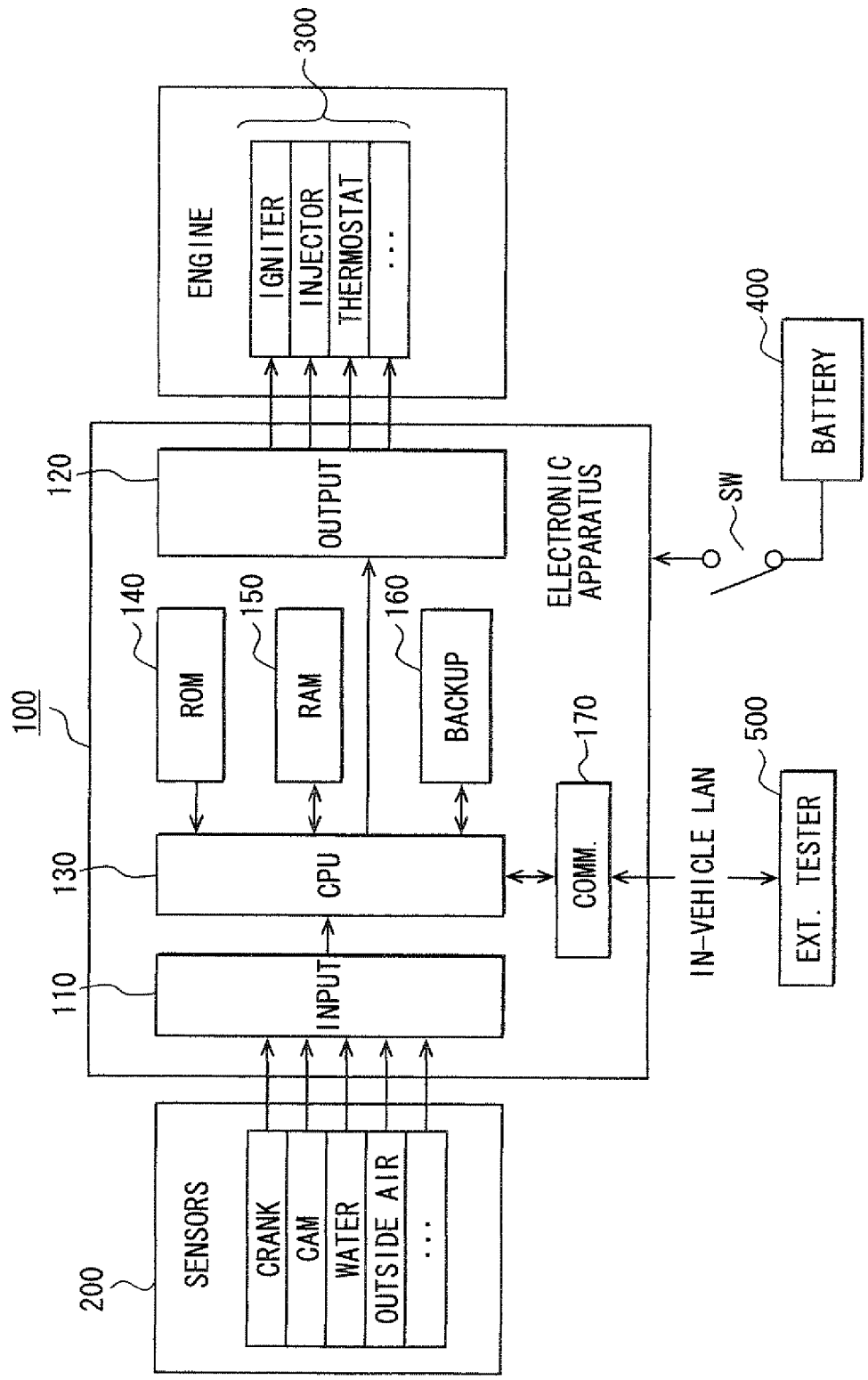
FIG. 1 is a block diagram illustrating a configuration of an electronic control unit according to a first embodiment of the present invention.

FIG. 1 is a block diagram illustrating a configuration of an electronic control unit 100 according to a first embodiment of the present invention. The electronic control unit 100 illustrated in FIG. 1 is a so-called engine ECU (Electronic Control Unit), which is an electronic apparatus for controlling an internal combustion engine. The electronic unit 100 is connected with sensors 200 such as a crank sensor and a cam sensor; and actuators 300, such as an igniter and an injector, for driving the internal combustion engine.

In detail, the electronic control unit 100 includes a CPU 130 to execute a process based on software programs; an input circuit 110 to receive input signals from the sensors 200 and input the received signals to the CPU 130; an output circuit 120 to output the control signals inputted from the CPU 130 to the actuators 300; a ROM 140 to store programs for the CPU 130; a RAM 150 to function as a work memory (i.e., temporary storage memory); a backup memory 160 used for data backup; and a communication circuit 170.

The electronic control unit 100 is connected to a battery 400 via a key switch SW. When an operation to turn ON the key switch SW is made by a vehicle occupant, the electronic control unit 100 is supplied with the power source from the battery 400 and is thereby started (or booted up). When an operation to turn OFF the key switch SW is made, the supplied power from the battery 400 is shut down and stops the electronic control unit 100.

In addition, the ROM 140 stores a program for controlling the internal combustion engine, a program for the failure diagnosis of the internal combustion engine, and the like. When the electronic control unit 100 is started or booted up based on the start of the power supply from the battery 400, the CPU 130 of the electronic control unit 100 executes processes based on the various programs recorded in the ROM 140. Thus, the CPU 130 of the electronic control unit 100 controls the internal combustion engine, diagnoses the sensors 200 and the actuators 300, and detects the failure inside the internal combustion engine.

In addition, the ROM 140 stores a communication program. The CPU 130 executes the program if needed and communicates with other terminals (electronic control unit etc.) connected to an in-vehicle LAN via the communication circuit 170.

For example, the in-vehicle LAN has a connection interface (not shown) to which a circuit tester 500 is connected from an outside. When the circuit tester 500 is connected to the in-vehicle LAN via the connection interface, the CPU 130 communicates with the circuit tester 500 via the communication circuit 170. The circuit tester 500 is given the diagnosis associated data indicating the result of the failure diagnosis.

In addition, the electronic control unit 100 of the present embodiment has a function to store the diagnosis associated data in the backup memory 160. The diagnosis associated data indicates the result of the above failure diagnosis and is updated in the RAM 150. The following explains an update and a backup of the diagnosis associated data achieved in the electronic control unit 100 simply and then in detail.

FIG. 2 is a graph illustrating an execution of the failure diagnosis in the electronic control unit 100, and an update of the diagnosis associated data in the RAM 150. The upper side of FIG. 2 is a graph illustrating the example of the execution frequency (i.e., the number of execution times) of the failure diagnosis with the axis of abscissa defined as time. The lower side of FIG. 2 is a graph illustrating the example of the update frequency (i.e., the number of update times) of the diagnosis associated data updated in the RAM 150 by the execution of the failure diagnosis with the axis of abscissa defined as time.

FIG. 2 illustrates the following. When an ON operation of the key switch SW (specifically ON operation of the accessory switch) is made, the electronic control unit 100 of the present embodiment is booted up in response to the power supply from the battery 400. First, the CPU 130 executes a failure diagnosis for detecting disconnection of the sensors 200. When the ignition switch is turned ON and the internal combustion engine is then started, a failure diagnosis is executed for detecting anomalies of the sensors 200 such as the crank sensor and the cam sensor.

Furthermore, when the temperature of the cooling water supplied to the internal combustion engine rises, a failure diagnosis is executed for detecting misfire while a failure diagnosis is executed for detecting the anomalies of the thermostat, etc. When the cooling water temperature fully rises and the internal combustion engine begins to operate stably, a series of failure diagnoses are ended. Henceforth, a part of the failure diagnoses is repeatedly executed periodically.

In the present embodiment, the failure diagnoses are executed as the above, and the diagnosis associated data stored in the RAM 150 is updated. Herein, in the present embodiment, the diagnosis result, which is the same as the past diagnosis result already written in the RAM 150, is not written in the RAM 150.

In the early stage of the operation of the internal combustion engine, there may be a case that a failure occurs and the corresponding diagnosis result is written in the RAM 150. In contrast, after completing a series of failure diagnoses, diagnosis results from the periodical failure diagnoses are typically the same in many cases. Therefore, the new data is no longer written in the RAM 150.

Thus, in the present embodiment, an elapsed time is measured or defined as a time that elapsed since diagnosis associated data was last or previously written in the RAM 150. In other words, an elapsed time may be defined as a time period during which new diagnosis associated data has not been written in the RAM 150. When the elapsed time exceeds a predetermined threshold value, the diagnosis associated data which the RAM 150 stores is backed up to the backup memory 160.

FIG. 3A illustrates a data configuration of the diagnosis associated data defined as backup target data in the electronic control unit 100 of the present embodiment. The diagnosis associated data are classified into failure diagnosis items executed in the electronic control unit 100; each item has a record which includes diagnosis result information, normal detection history information, and abnormal detection history information. Thus, the diagnosis associated data is configured as a table containing a group of records or a record group.

The normal detection history information signifies whether to be determined as being "normal" by the failure diagnosis. The abnormal detection history information signifies whether to be determined as being "abnormal" by the failure diagnosis. In the present embodiment, the diagnosis result information takes the values of "normal" or "abnormal"; in contrast, each of the normal detection history information and the abnormal detection history information takes the values of "present" or "absent."

The initial data of the diagnosis associated data stored in the ROM 140 has a record group, which contains: the diagnosis result information representing a value of "abnormal," the normal detection history information representing a value of "absent," and the abnormal detection history information representing a value of "absent."

The initial data is read out to a specified area of the RAM 150 by the CPU 130 at the first boot up of the electronic control unit 100. In detail, the specific area is defined as a backup target data storage area for storing temporarily predetermined backup target data.

The diagnosis associated data stored in the backup target data storage area of the RAM 150 is written by the CPU 130 in the backup memory 160 when the execution condition of the backup is satisfied, as shown in FIG. 3B. In the following, the data backed up in the backup memory 160 from the RAM 150 is expressed as "backup data."

In addition, the backup data (diagnosis associated data) written in the backup memory 160 is read out by the CPU 130 at the next boot up of the electronic control unit 100 and then written in the backup target data storage area of the RAM 150.

The diagnosis associated data is updated in the backup target data storage area of the RAM 150. The updated diagnosis associated data is written in the backup memory 160 by being written over the old diagnosis associated data in the backup memory 160. Thus, the diagnosis associated data which the backup memory 160 stores is changed according to the result of failure diagnoses.

Figure 4A:
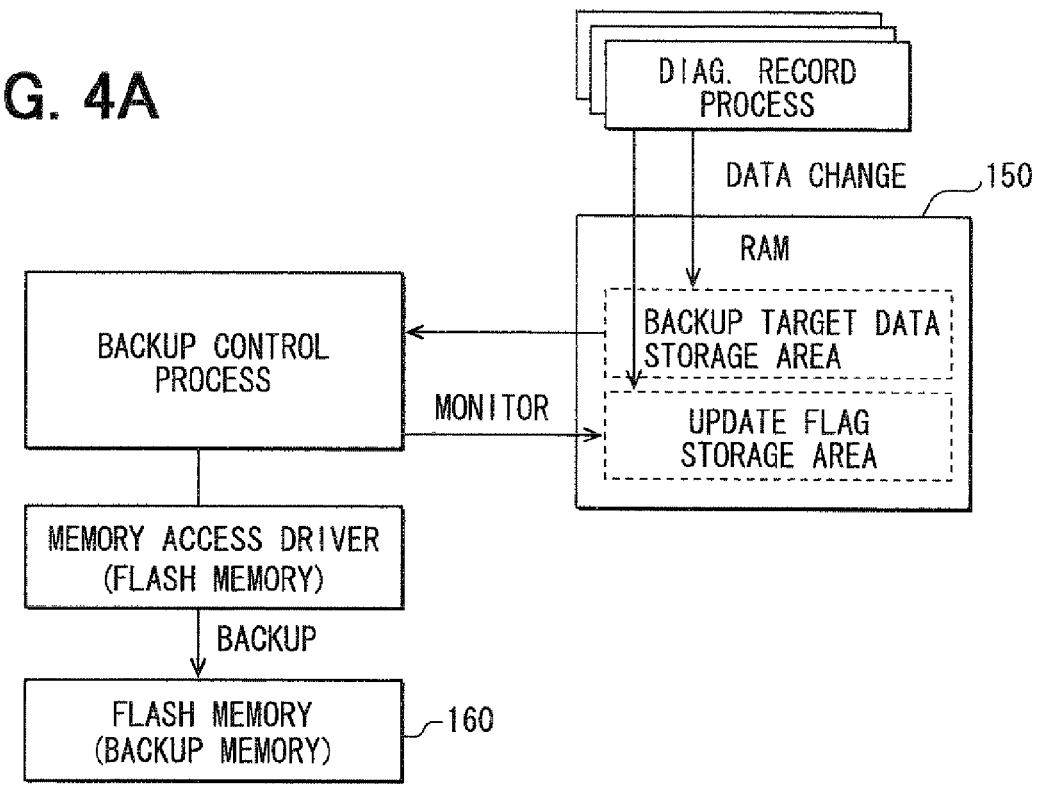
FIGS. 4A, 4B are block diagrams explaining backup methods of diagnosis associated data.

FIG. 4A explains a backup method for diagnosis associated data. The CPU 130 of the present embodiment executes a record process for diagnoses including a failure diagnosis, and a backup control process to back up the data stored in the backup target data storage area of the RAM 150, based on the program stored in the ROM 140.

In the diagnosis record process, the diagnosis associated data stored in the RAM 150 is updated if necessary while the failure diagnosis is executed. When the diagnosis associated data is updated, an update flag stored in an update flag storage area in the RAM 150 is set to the value representing ON.

In contrast, in the backup control process, the update flag stored in the RAM 150 is monitored to thereby determine whether the diagnosis associated data in the RAM 150 is updated or not by determining whether the update flag is set to the value representing ON.

In case that a time period during which diagnosis associated data has not been updated reaches a predetermined time period, the CPU 130 determines that the execution condition of the backup is satisfied. Thereby, the CPU 130 writes the diagnosis associated data, which is stored in the RAM 150, in the flash memory 160 as the backup memory 160 via the memory access driver by writing it over the diagnosis associated data stored previously in the flash memory 160. The diagnosis associated data stored in the flash memory 160 is thereby updated.

In addition, in the present embodiment, the electronic control unit 100 for the internal combustion engine control is mentioned as an example of the electronic control unit 100; thus, the backup memory 160 uses a flash memory known as an electrically data rewritable nonvolatile memory. In an electronic control unit used for other intended uses, an SRAM may be used as the backup memory 160.

Figure 4B:
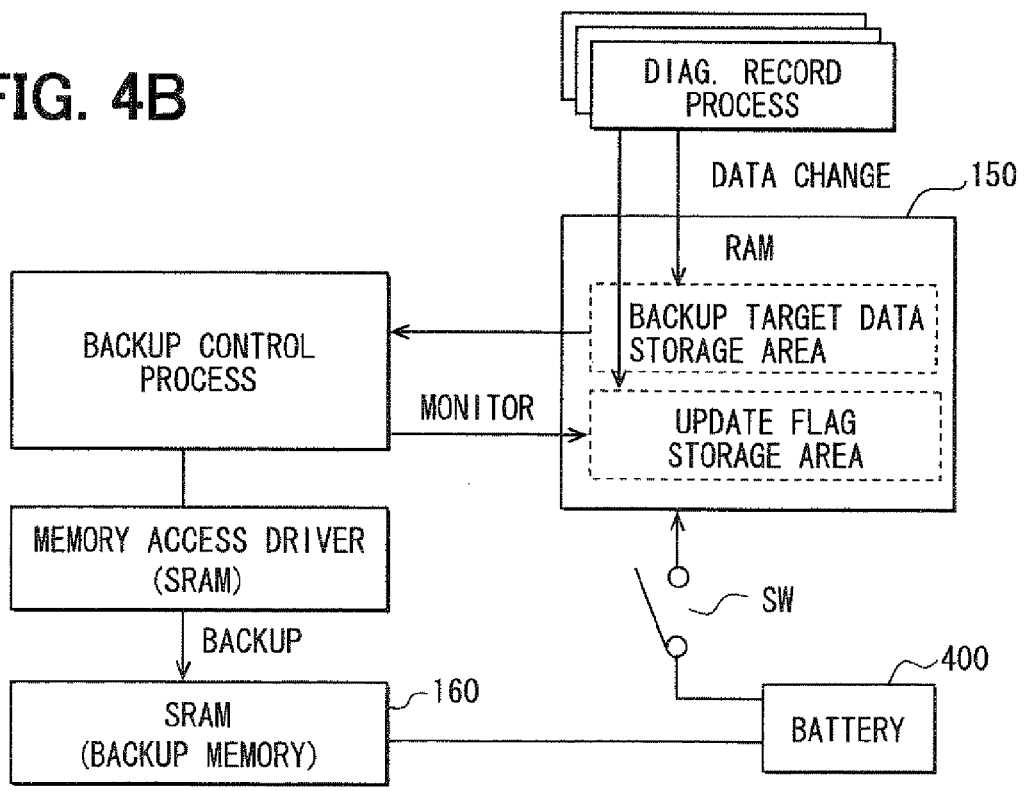

FIG. 4B explains an example using an SRAM as the backup memory 160. When the SRAM is used as the backup memory 160, the power supply is started by the ON operation of the key switch SW. The diagnosis associated data stored in the RAM 150, to which the power supply is shut down by the OFF operation of the key switch SW, is written in the SRAM, to which the power supply is continued from the battery 400 irrespective of ON or OFF operation of the key switch SW. The diagnosis associated data is thus backed up.

Whether the backup memory 160 uses a flash memory or SRAM is determined in consideration of the importance of the data, the cost, and the regulation. If an electronic control unit can allow a possibility that the data in the SRAM volatilizes because of the removal of the battery 400, the SRAM may be used as the backup memory 160.

Figure 5:
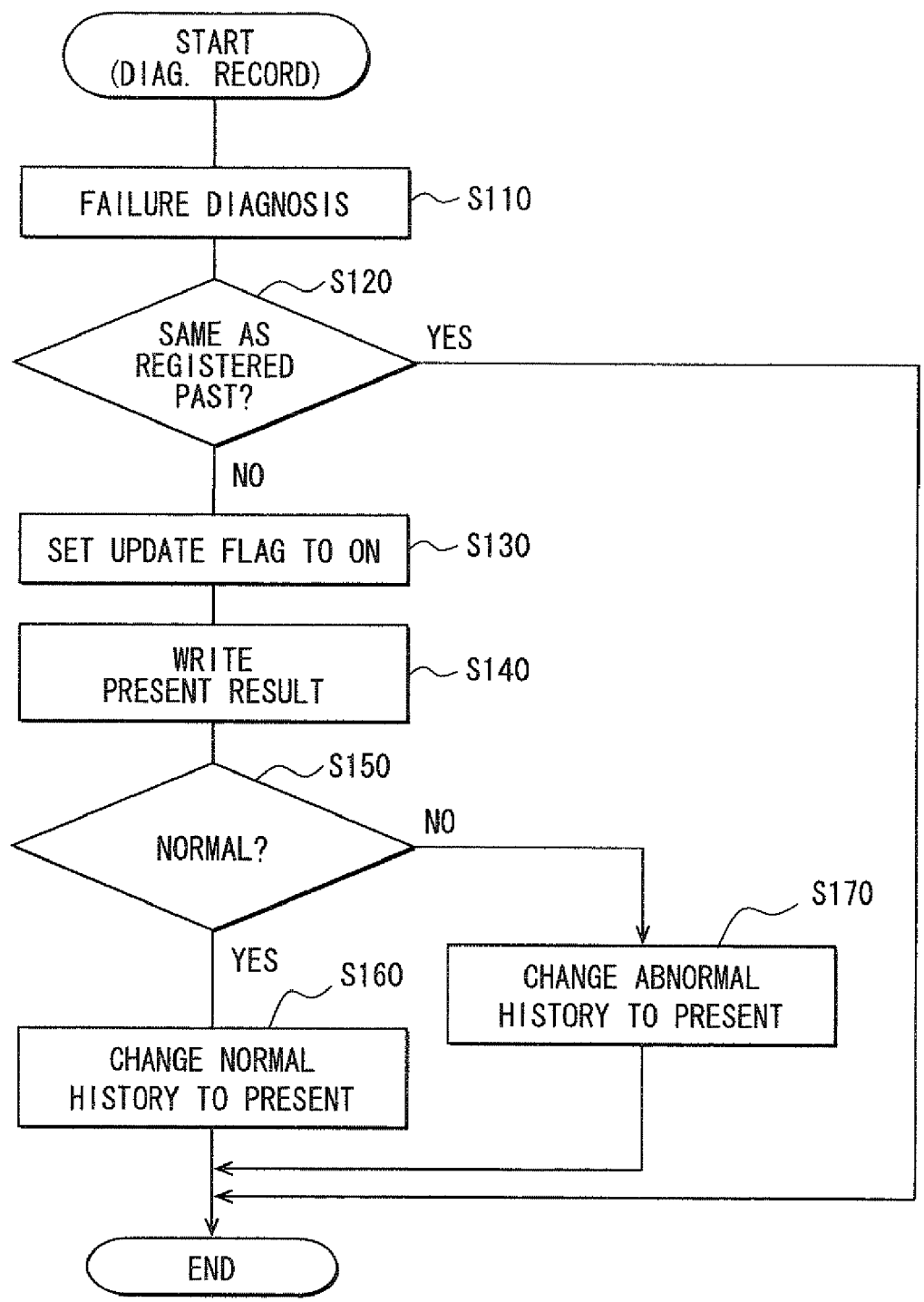
FIG. 5 is a flowchart illustrating a diagnosis record process executed by a CPU.
Figure 6:
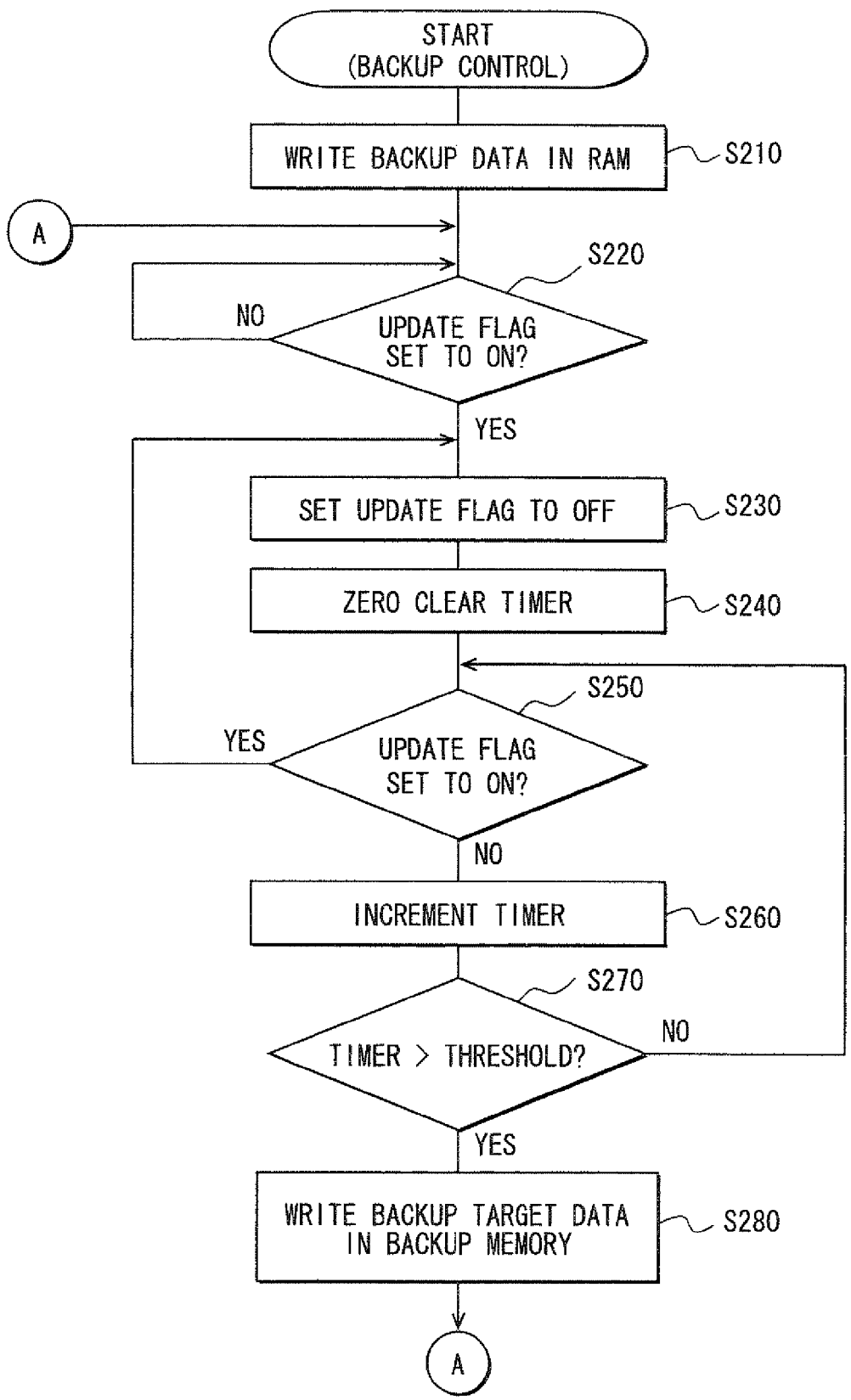
FIG. 6 is a flowchart illustrating a backup control process executed by the CPU.

Incidentally, the electronic control unit 100 of the present embodiment achieves the backup of the diagnosis associated data by the CPU 130 executing processes illustrated in FIG. 5 and FIG. 6.

FIG. 5 is a flowchart illustrating a diagnosis record process executed by the CPU 130. FIG. 6 is a flowchart illustrating a backup control process executed by the CPU 130. The CPU 130 executes a diagnosis record process illustrated in FIG. 5 at a predetermined time point for every diagnosis item. In addition, the backup control process is executed independently in parallel with the diagnosis recorded process.

When a diagnosis record process is started, the CPU 130 executes a failure diagnosis about a diagnosis item assigned to the diagnosis record process and obtains the diagnosis result (either the value "normal" or "abnormal") corresponding to the diagnosis item at S110. The example of the failure diagnosis is as mentioned above. For example, the process for detecting disconnection of the sensors 200 is executed as a failure diagnosis. When there is disconnection, "abnormal" is diagnosed. When there is no disconnection, "normal" is diagnosed.

Subsequently to S110, whether the present diagnosis result accords with the past diagnosis result of the corresponding diagnosis item stored in the RAM 150 is determined by referring to the record in the diagnosis associated data corresponding to the diagnosis item stored in the RAM 150 at S120.

In detail, when the record in the diagnosis associated data about the item diagnosed at the present time represents the diagnosis result "normal" and the diagnosis result at the present time is "normal," or when the above record represents the diagnosis result "abnormal" and the diagnosis result at the present time is "abnormal," it is determined that the diagnosis result at the present time accords with the past diagnosis result stored in the RAM 150. In contrast, in cases other than the above, i.e., in the case that one of the corresponding two diagnosis results is different from the other (one is "normal" whereas the other is "abnormal"), it is determined that the diagnosis result at the present time does not accord with the past diagnosis result.

When it is determined that the diagnosis result at the present time does not accord with the diagnosis result of the corresponding diagnosis item stored in the RAM 150, corresponding to "No" at S120, the CPU 130 advances to S130. In contrast, when it is determined that the diagnosis result at the present time accords with the diagnosis result of the corresponding diagnosis item stored in the RAM 150, corresponding to "Yes" at S120, the CPU 130 stops the present diagnosis record process without recording the present diagnosis result in the RAM 150, instead of advancing to S130.

In addition, at S130, the CPU 130 set the update flag, which is stored in the update flag storage area of the RAM 150, to the value corresponding to ON. In addition, as mentioned above, the update flag is data representing whether the backup target data is updated in the RAM 150, taking the value "1" as a value corresponding to ON and the value "0" as a value corresponding to OFF. The update flag is initialized by the value 0 (OFF) at the time of the boot up of the electronic control unit 100. In the following, setting the update flag to the value corresponding to ON or OFF is expressed by setting the update flag to ON or OFF or turning the update flag ON or OFF.

At S130, it is recorded in the RAM 150 that the backup target data is updated in the RAM 150 by setting the update flag to ON. Subsequently to S130, the CPU 130 writes the information of the diagnosis result at the present time over the information of the diagnosis result of the diagnosis item corresponding to the diagnosis associated data stored in the backup target data of the RAM 150. Thus, the CPU 130 updates the diagnosis associated data as the backup target data stored in the RAM 150 at S140. The CPU 130 then advances to S150.

In addition, when advancing to S150, the CPU 130 determines whether the diagnosis result at the present time is "normal." When it is determined that the diagnosis result is "normal," corresponding to "Yes" at S150, the CPU 130 changes the normal detection history information in the corresponding diagnosis item of the diagnosis associated data, which the RAM 150 stores, to the value of "present" at S160. The diagnosis record process is then ended.

In contrast, when it is determined that the diagnosis result "abnormal," corresponding to "No" at S150, the CPU 130 changes the abnormal detection history information in the corresponding diagnosis item of the diagnosis associated data, which the RAM 150 stores, to the value of "present" at S170. The diagnosis record process is then ended.

Then, the backup control process which the CPU 130 executes immediately after the boot up of the electronic control unit 100 is explained using FIG. 6. When the backup control process illustrated in FIG. 6 is started, the CPU 130 reads the backup data from the backup memory 160, and write the read data in the backup target data storage area of the RAM 150 to thereby copy the diagnosis associated data, which is stored in the backup memory 160, to the RAM 150 at S210.

In contrast, when the backup data is not stored in the backup memory 160, the initial data of the diagnosis associated data stored in the ROM 140 is read as a substitute for the backup data, and written in the backup target data storage area of the RAM 150.

In addition, subsequently to S210, the CPU 130 determines at S220 whether the update flag stored in the update flag storage area of the RAM 150 is set to ON. When it is determined that the update flag is set to ON, which corresponds to "Yes" at S220, the CPU 130 advances to S230. When it is determined that the update flag is not set to ON, which corresponds to "No" at S220, the CPU 130 stands by until the update flag is newly set to ON. When the update flag is set to ON, it advances to S230.

The CPU 130 changes the value of the above update flag stored in the RAM 150 to OFF at S230 and performs a zero clear of the timer at S240. In addition, the timer of the present embodiment is a software-based timer; thus, at S240, a parameter functioning as a time is initialized to zero to thereby perform the zero clear of the timer.

In addition, subsequently to S240, the CPU 130 determines at S250 whether the update flag stored in the update flag storage area of the RAM 150 is set to ON. When it is determined that the update flag is set to ON, which corresponds to "Yes" at S250, the CPU 130 returns to S230. The CPU 130 again changes the value of the above update flag stored in the RAM 150 to OFF and performs a zero clear of the timer. The CPU 130 then performs the above determination at S250. In addition, as mentioned above, the update flag in the RAM 150 is changed to ON at S130 of the diagnosis record process.

In contrast, when it is determined that the update flag is maintained at OFF, which corresponds to "No" at S250, the timer is incremented at S260. That is, the value of the parameter which functions as a timer is counted up.

In addition, after finishing the processing at S260, the CPU 130 determines at S270 whether the value of the timer exceeds a predetermined threshold value. When it is determined that the value of the timer is below (namely, equal to or less than) the predetermined threshold value, which corresponds to "No" at S270, the CPU advances to S250. Thus, in the present embodiment, the elapsed time, which starts after the update flag is finally set to ON, is measured with the timer. In other words, the elapsed time is a time period during which the update flag has not been set to ON.

When it is determined that the value of the timer exceeds the above threshold value, which corresponds to "Yes" at S270, the CPU 130 advances to S280. At S280, the backup target data (diagnosis associated data) stored in the backup target data storage area of the RAM 150 is written over the backup data (diagnosis associated data) stored in the backup memory 160, thereby updating the backup data stored in the backup memory 160. The CPU 130 then advances or returns to S220.

The CPU 130 again stands by until the update flag is again set to ON at S220. When the update flag is newly set to ON, the processing after S230 is executed. Executing of the above mentioned backup control process in the present embodiment causes the following. The elapsed time, which is a time that elapsed since the backup target data was previously or last updated in the RAM 150, is measured. When the elapsed time exceeds a threshold value, it is assumed that the execution condition of backup is satisfied. The backup target data (diagnosis associated data) is backed up to the backup memory 160.

According to the present embodiment, while the number of execution times of the backup is reduced, the data, which is stored in the RAM 150 and required to be backed up, can be backed up at suitable time point. Thus, according to the present embodiment, while a possibility that the backup target data volatilizes because of the sudden shutdown etc. is suppressed, the diagnosis associated data can be efficiently recorded in the backup memory 160.

In addition, the RAM 150 of the present embodiment functions as an example of a temporary storage memory. The diagnosis record process executed by the CPU 130 for every diagnosis item functions as an example of a process execution means or portion. The backup control process executed by the CPU 130 functions as an example of a read-out means or portion, a backup means or portion, or a measurement means or portion. In particular, the read-out means or portion may be realized by the processing at S210. The measurement means or portion may be realized by the processing at S240 to S260. The backup means or portion may be realized by the processing at S270 and S280.

Second Embodiment

Figure 7A:
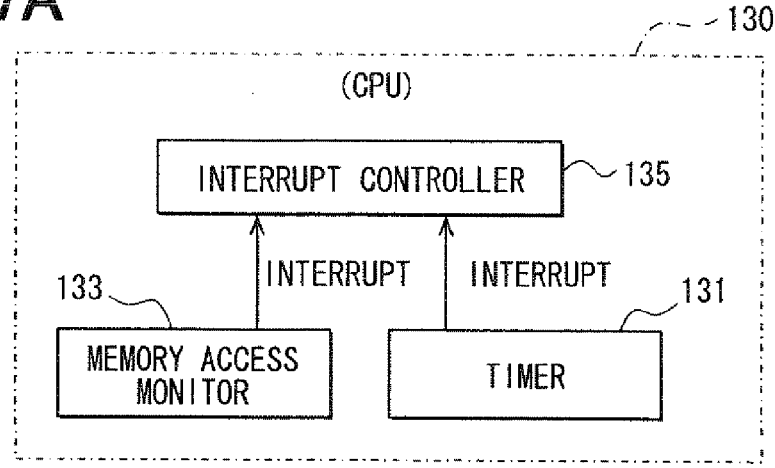
FIG. 7A is a block diagram illustrating a configuration of a CPU according to a second embodiment of the present invention.

The following describes a second embodiment of the present invention. FIG. 7A is a block diagram illustrating an internal configuration of the CPU 130 in the electronic control unit 100 according to the second embodiment of the present invention. The electronic control unit 100 of the second embodiment has many components identical to components of the electronic control unit 100 of the first embodiment; thus, in the following, the electronic control unit 100 of the second embodiment is selectively explained with respect to the different configuration from the first embodiment. Explanation for the electronic control unit 100 of the second embodiment is omitted with respect to the components indentical to those of the first embodiment.

As illustrated in FIG. 7A, the CPU 130 of the present embodiment internally contains as hardware sections a timer 131 and a memory access monitor circuit 133 in addition to an operational circuit (core based CPU) which executes data processing according to the program.

The timer 131 starts countdown of the timer value when the timer value is set. When the timer value becomes zero, the timer outputs an interruption request. The interruption request is inputted into an interruption controller 135 which the CPU 130 builds in. In the following, the interruption request outputted from the timer 131 is expressed as a "timer interruption request."

In contrast, the memory access monitor circuit 133 starts to monitor a memory area of a monitor target when the memory area (i.e., monitor area) of the monitor target is set. When a data write operation is made in the memory area, an interruption request is outputted. The interruption request is inputted into an interruption controller 135. In the following, the interruption request outputted from the memory access monitor circuit 133 is expressed as a "memory access interruption request."

The interruption controller 135 controls an interruption request. The timer interruption request inputted from the timer 131 and the memory access interruption request inputted from the memory access monitor circuit 133 are inputted to the operational circuit of the CPU 130 at a time point not to overlap each other.

Figure 8A:
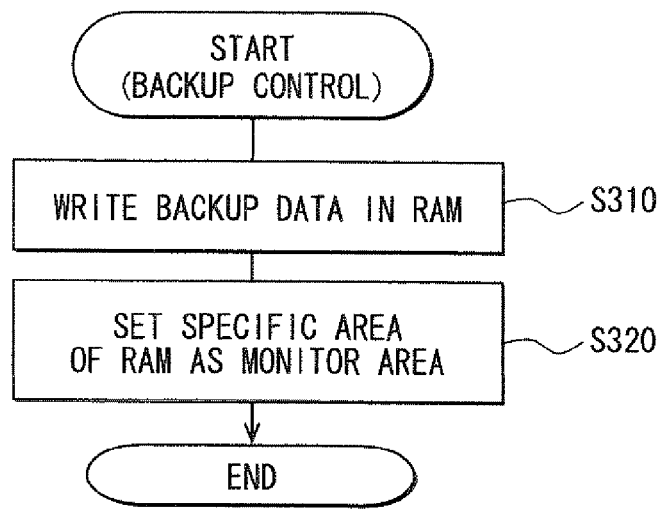
FIGS. 8A to 8C are flowcharts illustrating processes executed by the CPU according to the second embodiment.

In contrast, the electronic control unit 100 of the present embodiment executes the backup control process illustrated in FIG. 8A using the CPU 130 in a software-based manner at the boot up according to the program recorded in the ROM 140.

Figure 8B:
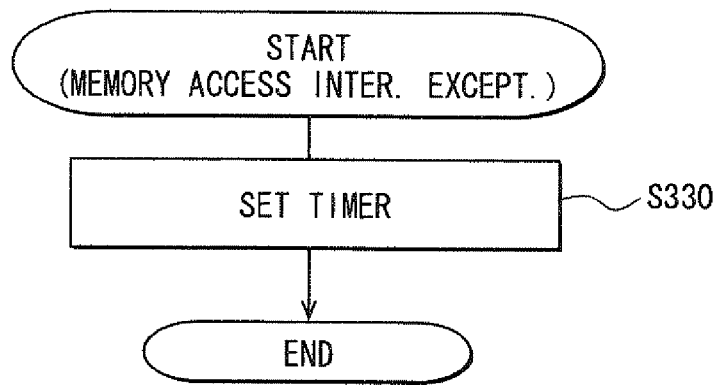

In addition, when a memory access interruption request occurs, the electronic control unit 100 executes, as an exceptional process to the memory access interruption request, the memory access interruption exception process illustrated in FIG. 8B using the CPU 130 in a software-based manner according to the program recorded in the ROM 140. In addition, when a timer interruption request occurs, a timer interruption exception process illustrated in FIG. 8 ($c$) is executed in a software-based manner using the CPU 130 as an exception process to the timer interruption request.

Figure 8C:
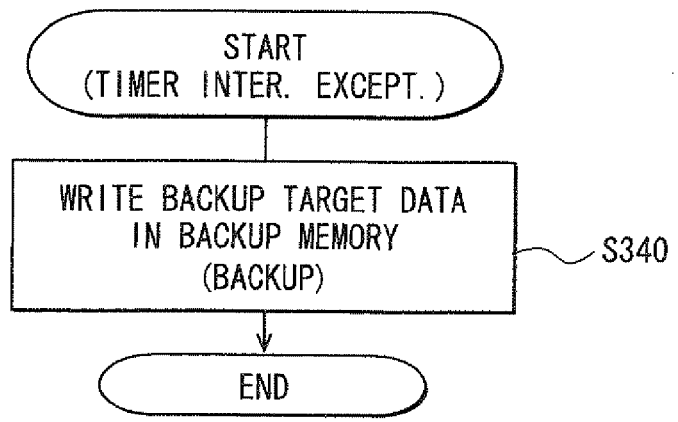

FIG. 8A is a flowchart illustrating a backup control process executed by the CPU 130 according to the second embodiment. FIG. 8B is a flowchart illustrating a memory access interruption exception process executed by the CPU 130. FIG. 8C is a flowchart illustrating a timer interruption exceptional process executed by the CPU 130.

When the backup control process is started, the CPU 130 reads out the backup data (diagnosis associated data) first from the backup memory 160 and writes the read data in the backup target data storage area of the RAM 150, similar to S210 in the first embodiment.

Then, the CPU 130 sets the backup target data storage area of the RAM 150 as a memory area for the monitor target at S320. After completing the setting, each time the data write operation to the backup target data storage area is made, a memory access interruption request is outputted from the memory access monitor circuit 133. Thus, after finishing the processing at S320, the CPU 130 ends the backup control process.

In contrast, when a memory access interruption request occurs, the CPU 130 starts a memory access interruption exception process and sets the timer 131 to a predetermined timer value corresponding to a predetermined time after which the timer interruption request is allowed to occur at S330. The memory access interruption exception process is then finished.

Further, when the timer interruption request occurs, the CPU 130 starts the timer interruption exception process to thereby write the backup target data stored in the backup target data storage area of the RAM 150 over the backup data (diagnosis associated data) which the backup memory 160 stores. Thus, the backup data stored in the backup memory 160 is updated, and the present timer interruption exception process is finished.

Figure 7B:
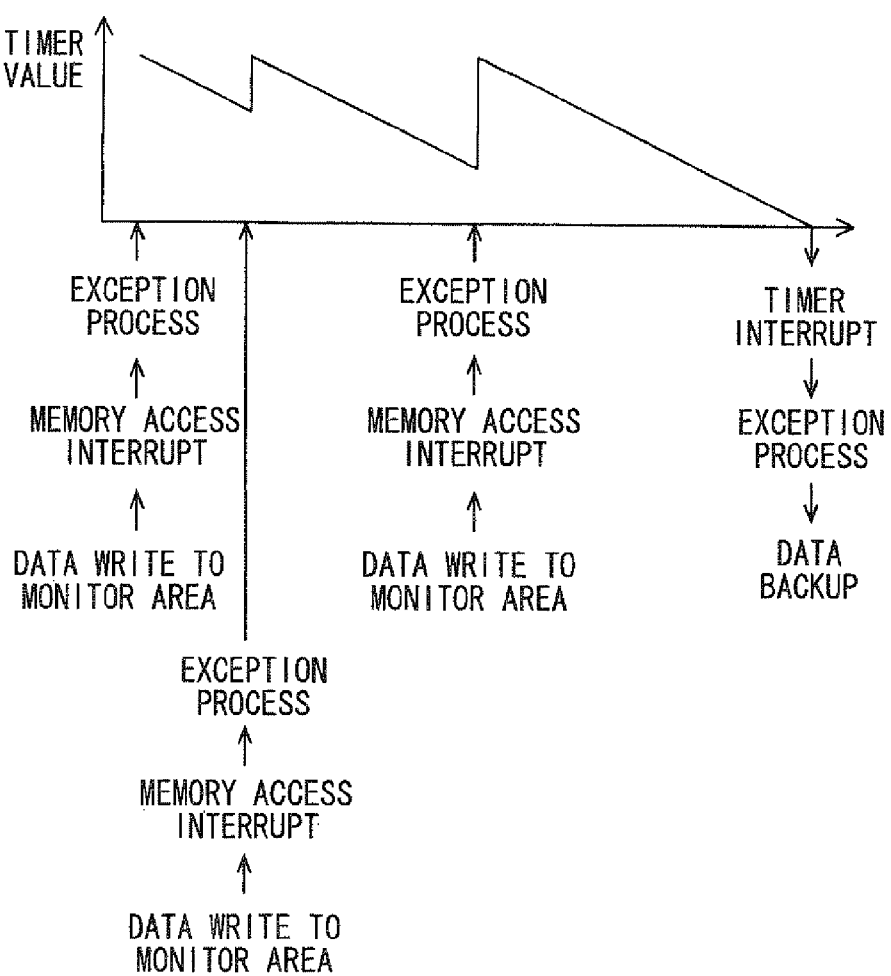
FIG. 7B is a graph illustrating variations of a measured timer value of a timer in the CPU.

The CPU 130 executes the above process so that the electronic control unit 100 of the present embodiment operates as illustrated in FIG. 7B. Thus, the present electronic control unit 100 operates as follows: When a data write to the memory area of the monitor target occurs, the memory access interruption request occurs; the memory access interruption exception process is executed by the CPU 130; the timer value is set to the value corresponding to the above predetermined time period; in addition, when a data write to the memory area of the monitor target occurs again by the time when the timer value becomes zero, the memory access interruption request occurs; the memory access interruption exception process is again executed by the CPU 130; and the timer value is returned to the value corresponding to the above predetermined time period.

In contrast, when a data write to the memory area of the monitor target does not occur for a predetermined time so that the timer value becomes zero, the timer interruption request occurs. The CPU 130 thereby executes the timer interruption exception process. The backup target data stored in the RAM 150 is backed up in the backup memory 160.

The electronic control unit 100 of the second embodiment can also provide the same effect as that of the first embodiment. In addition, according to the second embodiment, the timer 131 and the memory access monitor circuit 133 are built in the CPU 130 as a hardware or discrete circuit, section, or portion; the elapsed time that elapsed since data write to the memory area of the monitor target was last executed is measured; thus, a load applied to data processing of the CPU 130 is decreased as compared with the first embodiment.

In addition, the memory access monitor circuit 133 of the present embodiment may function as an example of a memory access monitor means, section, or portion. In addition, the CPU 130 functions as an example of a setting means or portion at S320, a timer control means or portion at S330, and a backup means or portion at S340.

Third Embodiment

The following describes a third embodiment of the present invention. Herein, in the electronic control unit 100 of the third embodiment, only a backup control process is slightly different from that of the first embodiment while other portions are comparable to those of the first embodiment. Thus, in the following, the backup control process executed by the CPU 130 is selectively explained in the present third embodiment.

FIG. 9 is a flowchart illustrating a backup control process executed by the CPU 130 according to the third embodiment. In FIG. 9, the same step number is given to the step of the backup control process provided with the same contents as those in FIG. 6.

In the backup control process of the present embodiment, like the first embodiment, after executing S210, S213 is executed. Then, it advances to S220 and the following process is executed like the first embodiment. That is, in the backup control process, first, the CPU 130 reads out the backup data (diagnosis associated data) from the backup memory 160 and writes the read data in the backup target data storage area of the RAM 150 at S210.

Then, the CPU 130 receives, via the input circuit 110, a signal representing a measurement result from a water temperature sensor which measures temperatures of cooling water of the internal combustion engine. The CPU 130 specifies the temperature of the cooling water based on the received signal representing the measurement result to thereby determine at S213 whether the temperature of the cooling water is over a predetermined threshold value.

When it is determined that the temperature of the cooling water is equal to or less than the threshold value, which corresponds to "No" at S213, the CPU 130 stands by until the temperature of the cooling water exceeds the threshold value. When it is determined that the temperature of the cooling water exceeded the threshold value, which corresponds to "Yes" at S213, the processing advances to S220.

Thus, in the present embodiment, until it is determined that the temperature of the cooling water rises to the predetermined temperature (threshold value) after starting of the internal combustion engine based on the measurement result of the water temperature sensor, the time measurement operation by the timer is prohibited. That is, the processing does not advance to S220 until the temperature of the cooling water rises to predetermined temperature. Therefore, even if the update flag is set to ON in the diagnosis record process, the time measurement is not started by the timer.

Therefore, even in the case where the update flag is set to ON before the temperature of the cooling water rises to a predetermined temperature in the present embodiment, the backup operation to the backup memory 160 cannot be executed until the temperature of the cooling water rises to the predetermined temperature and then elapsed time reaches the predetermined time period.

In addition, the reason for prohibiting time measurement operation and backup operation is because a thermostat cannot operate until the temperature of the cooling water rises and a part of failure diagnoses such as the thermostat cannot be thereby executed. In other words, it is because a series of failure diagnoses is not completed until the temperature of the cooling water rises and the internal combustion engine operates stably.

As explained above, when the diagnosis result is the same, the data in the RAM 150 is not updated. In case that a series of failure diagnoses is completed and only a periodical failure diagnosis is then executed, a possibility that the diagnosis associated data is updated in the RAM 150 is dramatically low. In contrast, a possibility that the diagnosis associated data is updated in the RAM 150 is high until a series of failure diagnoses is completed.

Therefore, the backup operation executed like the present embodiment can provide an advantage to help prevent increase of the number of execution times of backup operations by executing the backup operation although a possibility that the diagnosis associated data is further updated, thereby enabling the diagnosis associated data to be efficiently backed up in the backup memory 160. Therefore, according to the present embodiment, the number of times of data write to the backup memory 160 can be reduced, and the durability of the product can be raised.

In addition, the CPU 130 functions as an example of a prohibition means or portion at S213.

Fourth Embodiment

The following describes a fourth embodiment of the present invention. Herein, in the electronic control unit 100 of the fourth embodiment, a backup control process and diagnosis record process are slightly different from those of the first embodiment while other portions are comparable to those of the first embodiment. Thus, in the following, the backup control process and diagnosis record process executed by the CPU 130 in the present fourth embodiment are selectively explained.

FIG. 10A is a flowchart illustrating a backup control process executed by the CPU 130 according to the fourth embodiment. FIG. 10B is a flowchart illustrating a diagnosis record process executing for a specific diagnosis item. In FIG. 10, the same step number is given to the step of the processes provided with the same contents as those in FIGS. 5, 6.

In the backup control process of the present embodiment, after executing at S210 like the first embodiment, S217 is executed. Then, it advances to S220 and the following process is executed like the first embodiment.

That is, when the backup control process is started, the CPU 130 first reads out the backup data (diagnosis associated data) from the backup memory 160 and writes the read data in the backup target data storage area of the RAM 150 at S210. Then, the processing advances to S217, and the processing or the CPU 130 stands by until a specific failure diagnosis is completed.

In the present embodiment, as illustrated in FIG. 10B, among the diagnosis record processes for respective diagnosis items, the diagnosis record process of a specific diagnosis item is to notify the backup control process of an end thereof.

In addition, other diagnosis record processes other than the diagnosis record process of the specific diagnosis item are configured like those of the first embodiment. In the present embodiment, only the diagnosis record process of one certain specific diagnosis item among the multiple diagnosis items is configured as illustrated in FIG. 10B as a diagnosis record process of the above specific diagnosis item.

After starting the diagnosis record process illustrated in FIG. 10B, the CPU 130 determines affirmatively at S120 (see FIG. 5), or completes S160 or S170; then, the processing advances to S190, where the diagnosis record process is ended and notifies an execution task of the backup control process of the end thereof.

In contrast, the backup control process stands by at S217 until the notification of the end of the diagnosis record process of the specific diagnosis item is received. When it is determined that the notification of the end is received, which corresponds to "Yes" at S217, it is determined that the specific failure diagnosis is completed to thereby advance the processing to S220. Steps subsequent to S220 are then executed like the first embodiment.

The electronic control unit 100 of the fourth embodiment is thus explained above. The fourth embodiment can provide the same effect as the third embodiment can. Namely, the last diagnosis record process corresponding to a failure diagnosis executed just before a series of failure diagnoses is completed, namely, the last failure diagnosis executed in order is configured as illustrated in FIG. 10B. Until the last diagnosis record process is completed, the shift to S220 is prohibited. Until the series of failure diagnoses is completed, even if the update flag is set to ON by the diagnosis record process, the time measurement is not started by the timer.

According to the present embodiment, help prevent increase of the number of execution times of backup operations by executing the backup operation although a possibility that the diagnosis associated data is further updated, thereby enabling the diagnosis associated data to be efficiently backed up in the backup memory 160.

In addition, the CPU 130 functions as an example of a prohibition means or portion at S217.

Fifth Embodiment

The following describes a fifth embodiment of the present invention. In the electronic control unit 100 of the fifth embodiment, the backup target data is classified into multiple groups. A backup control process is executed for every group of backup target data. Except the configuration associated with the grouping, other configuration of the electronic control unit 100 is the same as that of the first embodiment. Therefore, in the following, the different portions from the first embodiment are selectively explained as the fifth embodiment.

Figure 11A:
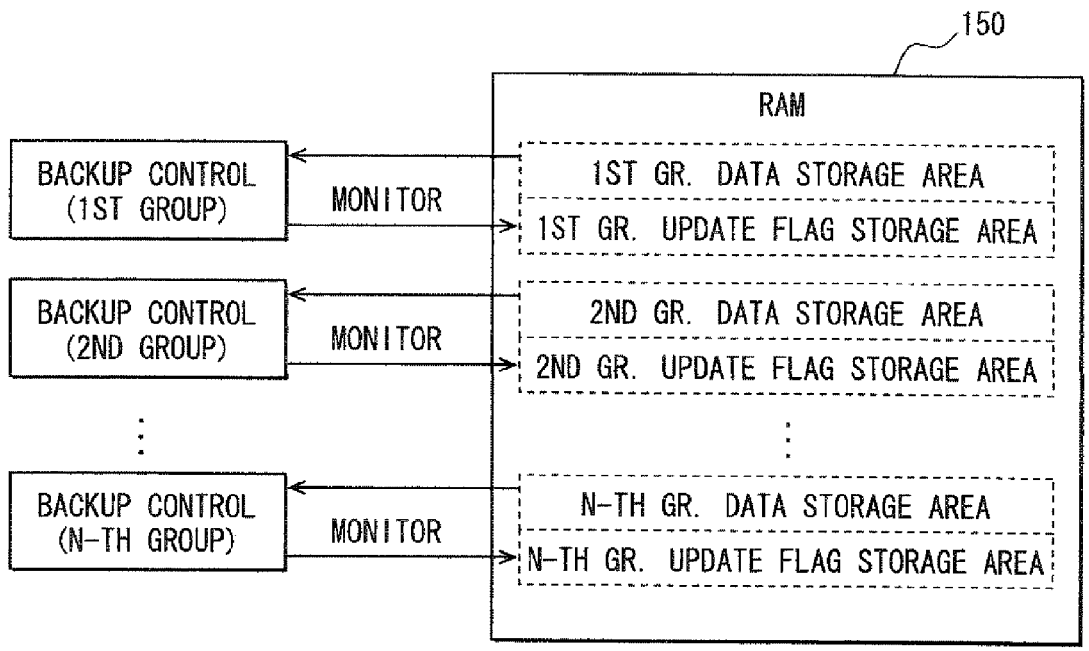
FIG. 11A is a diagram explaining data management in a RAM according to a fifth embodiment of the present invention.

FIG. 11A is a diagram explaining a data management and an execution of a backup control process in the RAM 150. As mentioned above, in the present embodiment, the backup target data is classified into multiple groups. In detail, each of the records of the diagnosis associated data is classified into one of the multiple groups.

In the RAM 150, a group data storage area is provided for storing temporarily the backup target data belonging to every group. On the assumption that there are N groups, FIG. 11A illustrates the RAM 150 storing from the first group data storage to the N-th group data storage. The collection of the first to the N-th group data storage areas corresponds to a backup target data storage area in the first embodiment.

In addition, in the present embodiment, an update flag is provided for every group in connection with the classification or grouping of the backup target data. That is, an update flag storage area for storing the update flag for every group is provided for every group in the RAM 150.

In the following, N groups are assigned with names of the first to the N-th group. The group data storage area corresponding to the i-th group is expressed as the i-th group data storage area, while the update flag storage area corresponding to the i-th group is expressed as the i-th group update flag storage area. Herein, i=1, 2, . . . , N.

In addition, when the backup control process of the present embodiment is explained in detail. In the backup control process corresponding to the i-th group, at S210 (refer to FIG. 6), the backup data of the backup target data belonging to the i-th group is read from the backup memory 160 and the read data is written in the backup target data storage area corresponding to the i-th group of the RAM 150 to thereby copy the diagnosis associated data belonging to the i-th group stored in the backup memory 160 to the RAM 150.

At S220 and S250, the i-th group's update flag stored in the i-th group update flag storage area is referred to, and the same determination as the first embodiment is made. When it is determined that the update flag is set to ON at S220, at S230, the i-th group's update flag is set to OFF. In addition, in the present embodiment, a timer is also independently provided for every group. At S240 and S260, the same processing as the first embodiment is executed to the i-th group's timer.

When the i-th group's timer exceeds a predetermined threshold value, which corresponds to "Yes" at S270, the backup target data (the i-th group's diagnosis associated data) stored in the i-th group data storage area of the RAM 150 is written over the i-th group's backup data (the i-th group's diagnosis associated data) stored in the backup memory 160. The i-th group's backup data which the backup memory 160 stores is thus updated at S280. The CPU 130 or processing then advances to S220.

In addition, the threshold value used at S270 may be defined as a value common to all the groups in the design phase or values individually set for the groups. That is, at S270 in FIG. 6, the backup control process can be configured such that the above-mentioned determination is made using a predetermined threshold value individually set to the i-th group.

Figure 11B:
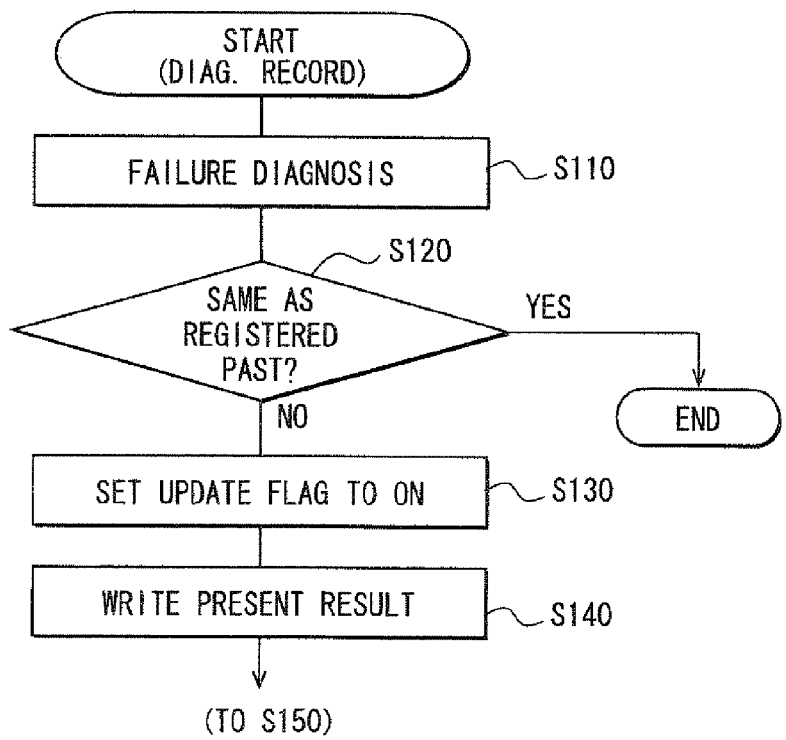
FIG. 11B is a flowchart illustrating a diagnosis record process according to the fifth embodiment.

FIG. 11B is a flowchart illustrating a diagnosis record process executed by the CPU 130 according to the fifth embodiment. In the present embodiment, the diagnosis associated data are classified into multiple groups. The diagnosis record processes are also indirectly classified into multiple groups corresponding to the respective diagnosis items. Therefore, in the following, a diagnosis record process which executes a failure diagnosis of a diagnosis item belonging to the i-th group is expressed as the i-th group's diagnosis record process.

As illustrated in FIG. 11B, in the i-th group's diagnosis record process, at S130, the i-th group's update flag is set to ON when the update flag is set to ON. At S140, the information on diagnosis result at the present time is written over the information on the diagnosis result corresponding to the diagnosis associated data of the i-th group stored in the i-th group data storage area in the RAM 150. Similarly, S160 and S170 (refer to FIG. 5) are executed for the diagnosis associated data stored in the i-th group data storage area. Thus, the CPU 130 updates the diagnosis associated data stored in the RAM 150.

The fifth embodiment is thus explained above. In the present embodiment, the backup target data is classified into the multiple groups to thereby have a disadvantage to increase the number of times of the writing to the backup memory 160, while having an advantage to allow the backup target data to be backed up at a suitable time point for every group.

For example, classification into the multiple groups is as follows. The series of diagnosis record processes are assumed to be executed over a predetermined period from the boot-up of the electronic control unit 100 to the end of all the execution of the series of diagnosis record processes. In the predetermined period, the diagnosis record processes can be classified into a group executed in the early stage, a group executed in the middle stage, and a group executed in the recent stage. Such classification into groups enables the backup operation to be executed from the group executed in the early stage in order.

Thus, according to the above classification into the multiple groups, while preventing the diagnosis associated data from volatilizing due to the sudden shutout etc., the number of times of data write to the backup memory 160 can be decreased. Each group's diagnosis associated data can be backed up at a suitable time point.

In addition, the fifth embodiment provides an example that the diagnosis associated data is classified into the multiple groups. When the backup target data covers additional data other than the diagnosis associated data, the diagnosis associated data may be handled as one group and the additional data may be dealt with as a group different from that of the diagnosis associated data in the electronic control unit 100.

Sixth Embodiment

The following describes a sixth embodiment of the present invention. The following selectively explains a configuration different from the electronic control unit 100 of the first embodiment.

Figure 12:
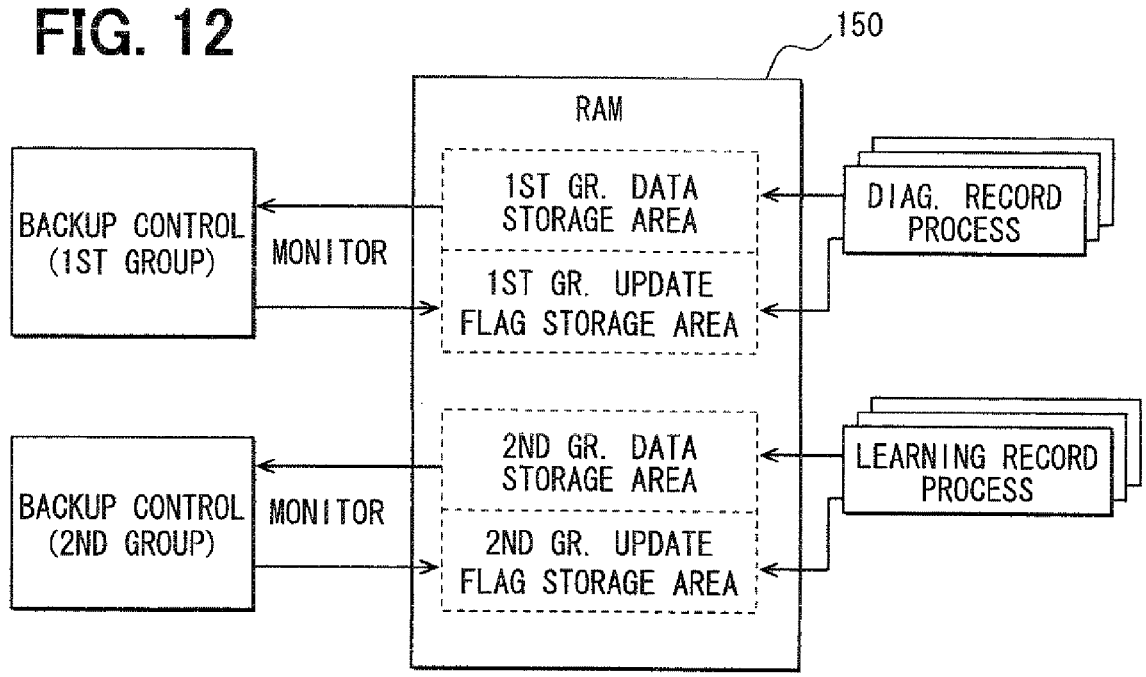
FIG. 12 is a diagram explaining data management in a RAM according to a sixth embodiment of the present invention.

FIG. 12 is a diagram explaining a data management and an execution of a backup control process in the RAM 150 in the present embodiment. In the present embodiment, the backup target data includes learning associated data including a learning value group of control parameters for vehicle controls and diagnosis associated data. Among the above backup target data, the diagnosis associated data is defined as a first group and learning associated data is defined as a second group.

In the RAM 150, a group data storage area is provided for storing temporarily the backup target data belonging to every group. In detail, an area for storing the diagnosis associated data temporarily is provided as a first group data storage area. An area for storing the learning associated data temporarily is provided as a second group data storage area.

In addition, in the present embodiment, an area for storing an update flag for every group is provided in the RAM 150. In detail, an area for storing the update flag for the diagnosis associated data temporarily is provided as a first update flag group storage area. An area for storing the update flag for the learning associated data temporarily is provided as a second update flag group storage area.

In the electronic control unit 100 of such a configuration, similar to the fifth embodiment, the CPU 130 executes a backup control process to each of the first and second groups. In addition, when the CPU 130 sets the update flag to ON at S130 in the diagnosis record process (refer to FIG. 5), the update flag of the group (first group) corresponding to the failure diagnosis is set to ON. At S140, the information on diagnosis result at the present time is written over the information on the diagnosis result corresponding to the diagnosis associated data stored in the first data storage area in the RAM 150. Similarly, S160 and S170 (refer to FIG. 5) are executed for the diagnosis associated data stored in the first group data storage area. Thus, the CPU 130 updates the diagnosis associated data stored in the RAM 150.

Figure 13:
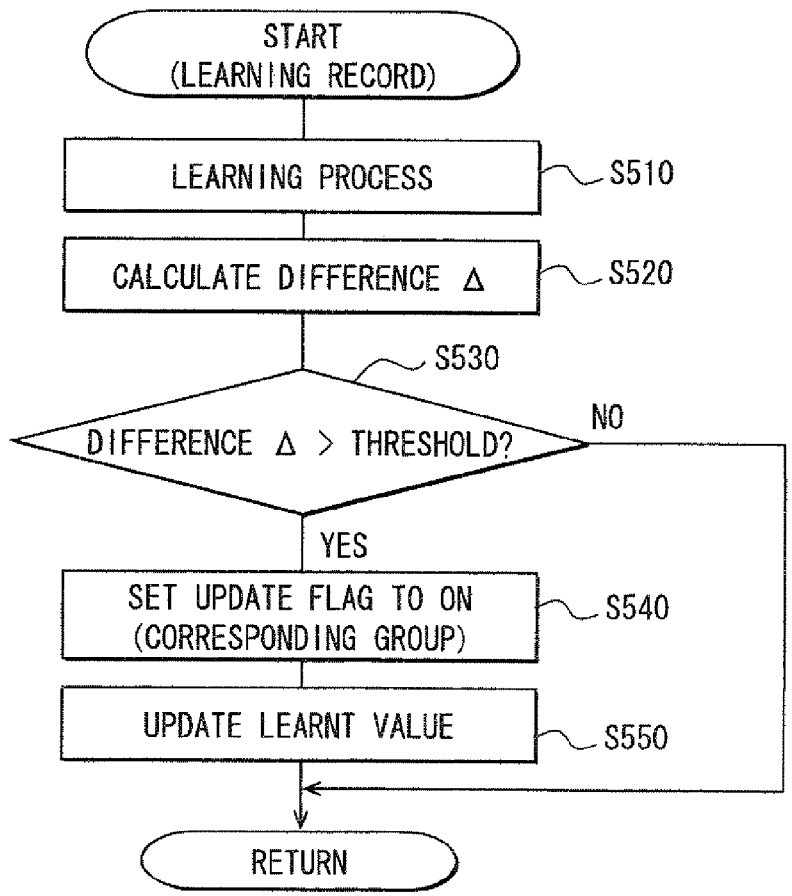
FIG. 13 is a flowchart illustrating a learning record process executed by a CPU according to a sixth embodiment of the present invention.

In addition, the CPU 130 according to the present embodiment repeatedly executes a learning record process including the procedure to calculate a learnt value of a control parameter for every control parameter, independently of the above-mentioned diagnosis record process or the backup control process. FIG. 13 is a flowchart illustrating a learning record process executed by the CPU 130.

When the learning record process is started, the CPU 130 calculates a learnt value of the control parameter by executing the learning process assigned to the learning record process at S510. The control parameter includes, for instance, an amount of air/fuel ratio change, for example.

In addition, after finishing the learning process, the CPU 130 calculates a difference (Δ) at S520. The difference is between a learnt value P calculated at S510 at the present time and a learnt value P', which is past data of the control parameter corresponding to the learnt value P and is described in the learning associated data stored in the second group data storage area in the RAM 150.

For example, when the control parameter is a scalar value, the absolute value of a difference P−P' between the learnt value P at the present time and the learnt value P' stored in the RAM 150 is calculated as a difference Δ. For example, when the control parameter is a vector value, a norm of a difference P−P' between the learnt value P and the learnt value P' is calculated as a difference Δ.

In addition, after finishing S520, the CPU 130 or processing advances to S530, wherein it is determined whether the difference Δ is over a predetermined threshold value. When it is determined that the difference Δ is over the threshold value, which corresponds to "Yes" at S530, the update flag of the corresponding group (second group) is set to ON at S540 In addition, the learnt value P at the present time is written over the corresponding learnt value of the past in the learning associated data stored in the second group data storage area in the RAM 150 at S550. Thus, the CPU 130 updates the learning associated data stored in the RAM 150. Then, the learning record process is ended.

In contrast, when it is determined that the difference Δ is equal to or less than the threshold value, which corresponds to "No" at S530, the CPU 130 ends the present learning record process without executing S540 and S550. That is, the learning record process is ended, without writing the calculated learnt value P in the learning associated data in the RAM 150.

In the present electronic control unit 100, such a learning record process is executed for every control parameter with a cycle according to the control parameter to thereby execute the learning of the control parameter periodically. When the difference Δ from the stored value at the previous time becomes significantly large, i.e., when the difference Δ exceeds the threshold value, the newest learnt value P is written in the learning associated data in the RAM 150.

The sixth embodiment is thus explained above. According to the present embodiment, the backup of the learnt value can be also executed at a suitable time point. In addition, the learnt value of the control parameter can be backed up with the procedure comparable with that of the diagnosis associated data. Without need of intricately controlling the time point for the execution of the backup, each type of data can be backed up at a suitable time point in a simple procedure.

Seventh Embodiment

The following describes a seventh embodiment of the present invention. In the first embodiment, as the diagnosis associated data, the data representing the diagnosis result every diagnosis item with the failure "present" or "absent" is recorded in the RAM 150 or the backup memory 160. Another method of recording failures of vehicles is known. For instance, when a failure occurs, codes representing failure types (referred to as failure codes) are recorded in the RAM 150 or the backup memory 160.

The electronic control unit 100 of the seventh embodiment applies the present invention to the electronic control unit which records the failure codes in the RAM 150 or the backup memory 160. Herein, the electronic control unit 100 of the present embodiment is different from the first embodiment in the recording method of the diagnosis associated data, but comparable in others. In the following, the electronic control unit 100 of the seventh embodiment the is selectively explained with respect to the different configuration from the first embodiment. Explanation is omitted for others.

Figure 14A:
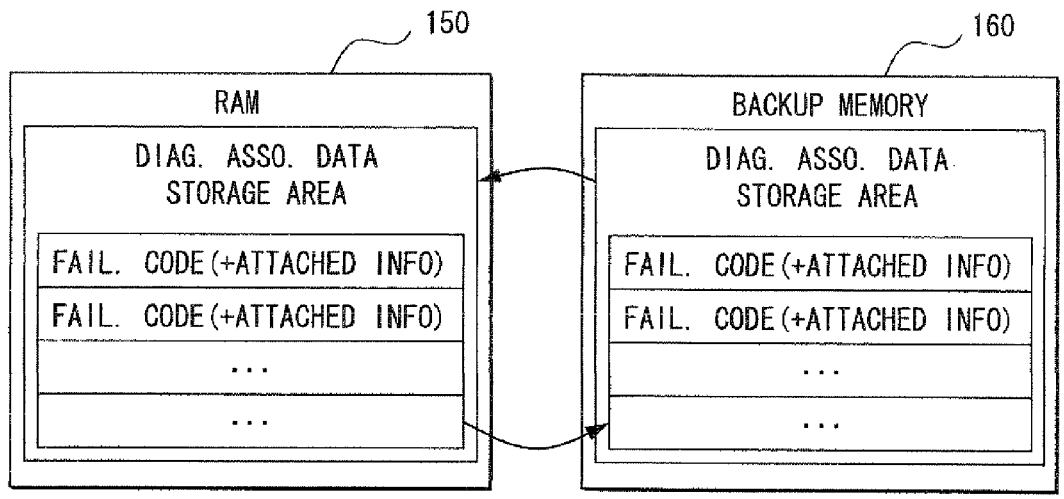
FIG. 14A is a diagram illustrating a data configuration of diagnosis associated data according to a seventh embodiment of the present invention.

FIG. 14A illustrates a configuration and management procedure of the diagnosis associated data of the present embodiment. As illustrated in FIG. 14A, the diagnosis associated data of the present embodiment includes a collection of records containing (i) failure codes and (ii) corresponding attached information such as information on detection dates and times of failures. An area for storing the diagnosis associated data is previously defined in the backup memory 160 and RAM 150. In addition, the diagnosis associated data storage area in the RAM 150 corresponds to the backup target data storage area in the first embodiment.

In the present electronic control unit 100, at S210 of the backup control process, the backup data (diagnosis associated data) stored in the above diagnosis associated data storage area of the backup memory 160 is written in the above diagnosis associated data storage area of the RAM 150. The copy of the diagnosis associated data is thus stored in the RAM 150.

In addition, the diagnosis associated data of the present embodiment takes null data where the record is not registered as long as there is no failure of the vehicle. In the present embodiment, regardless of whether it is null data at S210, the data in the diagnosis associated data storage area is copied as it is to the RAM 150 as the diagnosis associated data.

Similarly, at S280, the data in the diagnosis associated data storage area in the RAM 150 is written in the diagnosis associated data storage area of the backup memory 160 as the diagnosis associated data. The diagnosis associated data is thus read and backed up in the present embodiment.

Figure 14B:
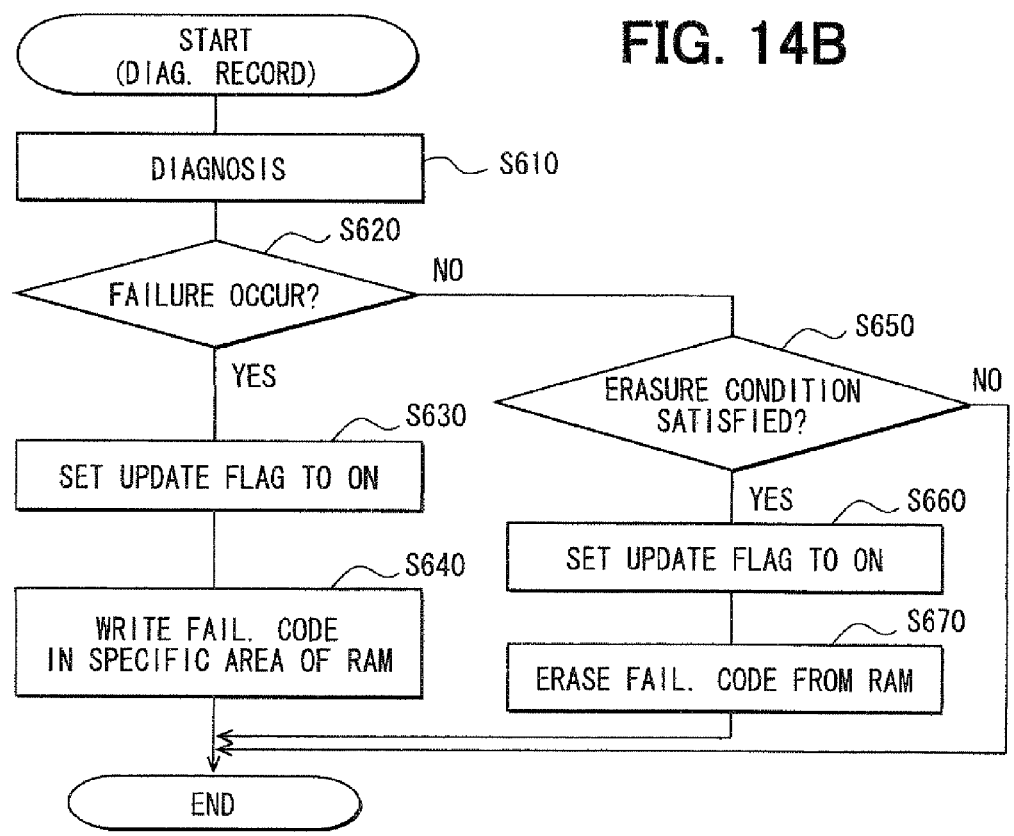
FIG. 14B is a flowchart illustrating a diagnosis record process according to the seventh embodiment.

In contrast, the CPU 130 executes the diagnosis record process illustrated in FIG. 14B instead of the diagnosis record process illustrated in FIG. 5. FIG. 14B is a flowchart illustrating a diagnosis record process executed by the CPU 130 according to the seventh embodiment.

When a diagnosis record process in FIG. 14B is started, the CPU 130 executes a failure diagnosis about a diagnosis item assigned to the diagnosis record process at S610. When a failure corresponding to the diagnosis item occurs in the vehicle, the failure diagnosis detects such a failure corresponding to the diagnosis item.

When a failure corresponding to the diagnosis item is detected, it is determined as "Yes" at S620, then advancing the processing to S630. In contrast, when a failure corresponding to the diagnosis item is not detected, it is determined as "No" at S620, then advancing the processing to S650. Herein, when there is no vacancy in the diagnosis associated data storage area in the RAM 150, even if a failure is detected at previous S610, it is determined formally as "No" at S620, then advancing the processing to S650.

When advancing to S630, the CPU 130 sets the update flag, which is stored in the RAM 150, to ON. Then, a record which includes the failure code and attached information corresponding to the detected failure is written in the diagnosis associated data storage area in the RAM 150 at S640.

Herein, when the record of the same failure code as that of the failure generated at the present time is already registered in the diagnosis associated data storage area, the record of the failure generated at the present time is written over the record already registered in the diagnosis associated data storage area. Thus, the CPU 130 updates the diagnosis associated data stored in the RAM 150. Then, the present diagnosis record process is ended.

In contrast, when advancing to S650, it is determined whether an erasure condition of the failure code corresponding to the item diagnosed at the present time is satisfied. Herein, when the failure code corresponding to the item diagnosed at the present time is not stored in the diagnosis associated data storage area of the RAM 150, it is determined formally that the erasure condition is not satisfied. In addition, in spite of having detected failure, when advancing to S650 for the reason mentioned above, it is determined formally that the erasure condition is not satisfied.

In contrast, when a failure is not detected at the present time and the failure code of the corresponding item is stored in the diagnosis associated data storage area of the RAM 150, either of the following two determinations is made. That is, when it is inferred that the failure has been solved for a long period of time, it is determined that the erasure condition of the failure code is satisfied. When it is inferred that the failure is temporarily solved, it is determined that the erasure condition of the failure code is not satisfied.

In addition, whether the failure has been solved for a long period of time can be determined based on the attached information accompanying the failure code stored in the RAM 150. For example, when the detection date of the failure is recorded in the attached information, whether the failure has been solved for a long period of time can be determined by whether a predetermined time period elapses from the detection date.

In addition, when the above attached information includes the number of trips, whether the failure has been solved for a long period of time is determined based on the number of trips after the failure finally occurred. In addition, one trip is defined as a period during which the internal combustion engine of the vehicle is started and, then, stopped.

When it is determines that the erasure condition is not satisfied at S650, the CPU 130 ends the present diagnosis record process without executing S660 and S670. When it is determined that the erasure condition is satisfied at S650, the update flag stored in the RAM 150 is set to ON at S660. Further, the record including the failure code, the erasure condition of which is satisfied, as well as the attached information is erased from the diagnosis associated data storage area in the RAM 150. The diagnosis associated data is thus updated at S670. Then, the present diagnosis record process is ended.

The seventh embodiment is thus explained above. The electronic control unit 100 of the seventh embodiment can also provide an advantage to back up the failure code in the backup memory 160 appropriately like the first embodiment.

Eighth Embodiment

The following describes an eighth embodiment of the present invention. In the electronic control unit 100 of the eighth embodiment, only a part of the backup control process is different from the electronic control unit 100 of the first embodiment. The following selectively explains a configuration different from the electronic control unit 100 of the first embodiment.

Figure 15A:
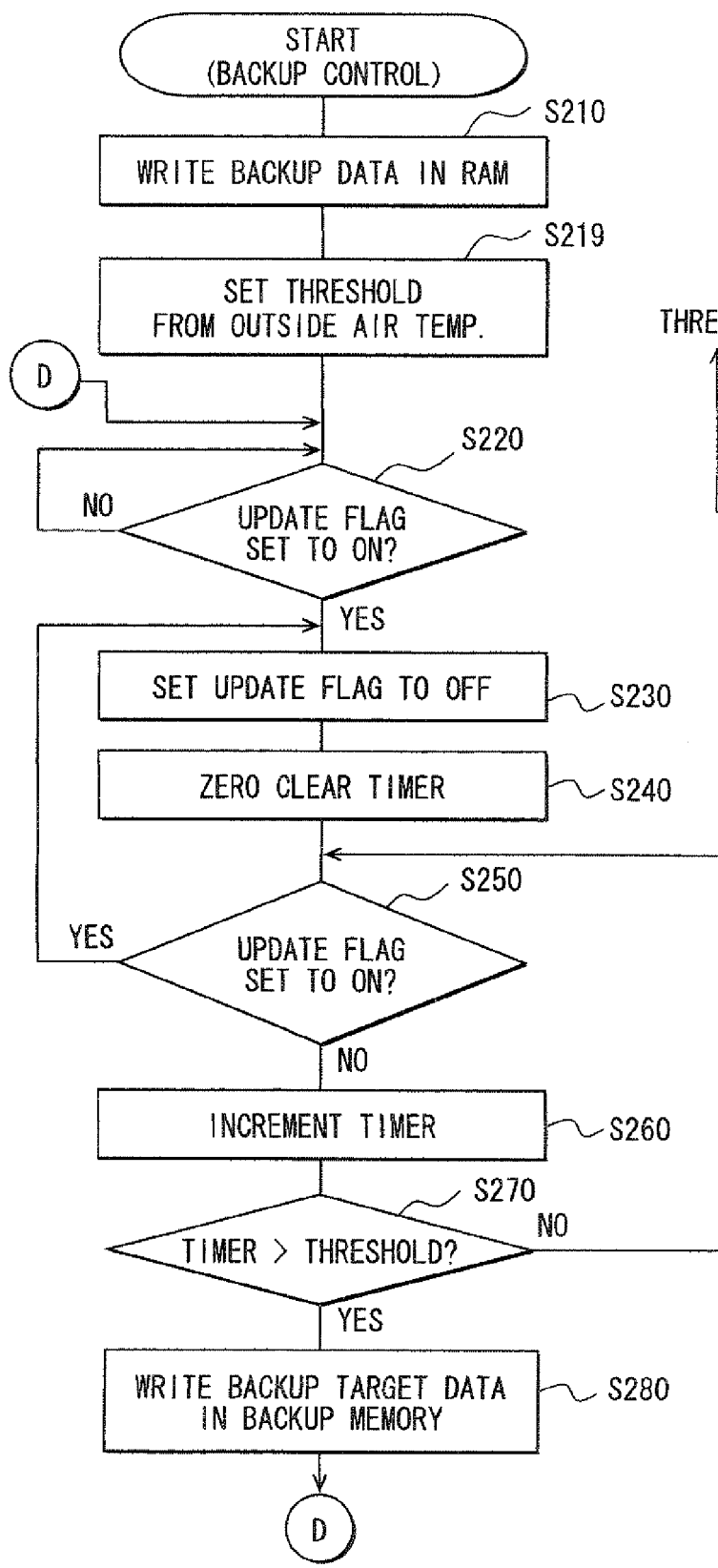
FIGS. 15A, 15B are a flowchart and related graph associated with a backup control process according to an eighth embodiment of the present invention.

FIG. 15A is a flowchart illustrating a backup control process executed by the CPU 130 according to the eighth embodiment. In FIG. 15A, the same step number is given to the step of the backup control process, which is provided with the same contents in FIG. 6.

In the backup control process of the present embodiment, after executing S210 like the first embodiment, S219 is executed, as shown in FIG. 15A. Then, it advances to S220 and the following process is executed like the first embodiment.

At S219, an outside air temperature is specified based on a signal for showing a measurement from an air temperature probe, which measures an outside air temperature and inputted via the input circuit 110. Based on the specified outside air temperature, a threshold value used for determining at S270 is set. In detail, based on "relation between a threshold value, which should be set, and an outside air temperature" recorded in the ROM 140, the threshold value is set as a larger value when the outside air temperature is lower, as illustrated in FIG. 15B.

Figure 15B:
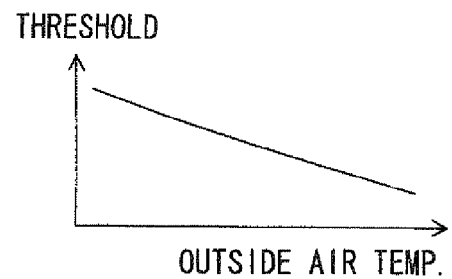

FIG. 15B shows a graph representing the above "relation between a threshold value, which should be set, and an outside air temperature." The relation between a threshold value, which should be set, and an outside air temperature is defined through an experiment, and is recorded in the ROM 140 in a map or function.

Herein, the purpose of setting the threshold value based on outside air temperature is as follows. It is applied to the case where the update flag is set to ON in the failure diagnosis executed immediately after starting of the internal combustion engine. Then, even when there is no writing of new data to the RAM 150 and, thereby, the zero clear of the timer is not carried out, it is intended that the timer value does not exceed the threshold value until a series of failure diagnoses is completed. Therefore, the experiment is made to try to realize such a purpose, thus obtaining an appropriate threshold value.

According to the electronic control unit 100 of the present embodiment, the execution of the backup operation of the diagnosis associated data is prevented until a series of failure diagnoses is completed. The number of times of data write to the backup memory 160 can be thus decreased. The diagnosis associated data is thus efficiently backed up. In addition, the CPU 130 functions as an example of a threshold setting means or portion at S219.

Each or any combination of processes, steps, or means explained in the above can be achieved as a software portion or unit (e.g., subroutine) and/or a hardware portion or unit (e.g., circuit or integrated circuit), including or not including a function of a related device; furthermore, the hardware portion or unit can be constructed inside of a microcomputer. Furthermore, the software portion or unit or any combinations of multiple software portions or units can be included in a software program, which can be contained in a computer-readable storage media or can be downloaded and installed in a computer via a communications network.

Aspects of the disclosure described herein are set out in the following clauses.

As a first aspect of the disclosure, an electronic apparatus is provided as follows. The electronic apparatus is provided with (i) a volatile temporary storage memory to store data temporarily, (ii) a process execution portion to execute a predetermined process and write data, which results from the executing, in the temporary storage memory, and (iii) a backup memory to store to hold backup data corresponding to the data written in the temporary storage memory, at least part of the data held in the temporary storage memory being predetermined as storage target data. The electronic apparatus comprises: a backup portion configured to write a copy of the storage target data in the backup memory as the backup data; and a measurement portion configured to measure a non-write time period which is an elapsed time that elapsed since data associated with the storage target data was previously written in the temporary storage memory. Herein, the backup portion is further configured to write the copy of the storage target data in the backup memory as the backup data when it is determined that the non-write time period reaches a predetermined threshold value based on a measurement result by the measurement portion.

For example, according to the first aspect, backup operation is not executed in the period during which the data is frequently written in the temporary storage memory. Therefore, even if the above-mentioned threshold value is shortened to some extent, the execution frequency of the backup operation does not immediately increase.

On the other hand, if the threshold value is shortened, the data written in the temporary storage memory can be backed up in short time, thereby decreasing a possibility of failing in the backup because of the sudden shutdown etc. According to the above configuration, while the possibility of missing or failing in the backup is suppressed low, the execution frequency of the backup operation can be reduced. The backup operation can be thus executed efficiently.

As an optional aspect of the first aspect, the electronic apparatus may further comprise a read-out portion configured to read out the backup data stored in the backup memory and write the read backup data in the temporary storage memory when an operation to turn ON the electronic apparatus is made. Herein, the process execution portion may be further configured to write data, which expresses an execution result obtained from an execution of the predetermined process and belongs to the storage target data, in the temporary storage memory by overwriting data, which expresses a past execution result written in the temporary storage memory by the read-out portion; the measurement portion may be further configured to measure, as the non-write time period, the elapsed time that elapsed since the storage target data stored in the temporary storage memory was previously changed in the temporary storage memory.

According to the above electronic apparatus, the time point of executing backup is determined by the elapsed time that elapsed since the data in the temporary storage memory corresponding to the data already backed up was last changed. In other words, the time point of executing backup is determined by the time period during which the data in the temporary storage memory corresponding to the data already backed up has not been changed. Thus, the new data can be backed up efficiently, and the possibility of failing in the backup can be further reduced.

As an optional aspect of the first aspect, the storage target data may be classified into a plurality of groups. The measurement portion may be further configured to measure, with respect to each of the groups, the non-write time period which is the elapsed time that elapsed since data, which is associated with the storage target data and belongs to the each of the groups, was previously written in the temporary storage memory. The backup portion may be further configured to, with respect to each of the groups, write a copy of the storage target data, which belongs to the each of the groups, in the backup memory as the backup data on a condition that the non-write time period of the each of the groups exceeds a threshold value.

According to the above configuration, when the time points of the executions of the various types of processes are different from each other, the new data written in the temporary storage memory by the execution of each of the processes can be backed up at an appropriate time point.

Further, as an optional aspect, the backup portion may be further configured to, determine, with respect to the each of the groups, whether the non-write time period of the each of the groups exceeds the threshold value based on information on the threshold value individually defined to the each of the groups.

According to the above configuration, the new data written in the temporary storage memory by each process can be backed up to much more suitable time point.

In addition, suppose the case that multiple processes are sequentially carried out by the process execution means. In such a case, if the backup operation of the storage target data is executed in the early stage in the series of the processes, the storage target data, which is generated in the later stage of the series of the processes may be backed up after a short time.

Thus, as an optional aspect of the first aspect, a prohibition portion may be configured to prohibit an operation of at least one of the measurement portion and the backup portion until a specific process among predetermined processes is completed by the process execution portion.

If the prohibition means is thus formed in the electronic apparatus, the backup operation in the early stage of the series of the processes can be prohibited. The execution frequency of the backup operation can be therefore reduced and the data can be backed up efficiently.

As an optional aspect of the first aspect, the process execution portion may execute as the predetermined process a failure diagnosis process to diagnose a presence or absence of a failure in a vehicle; and the storage target data may be data representing an execution result of the failure diagnosis process.

The failure of the vehicle does not occur in high frequency. Even if the failure diagnosis process is repeatedly executed, the results of the repeated failure diagnosis processes typically represent "no failure," In addition, in many cases, the failure of the vehicle is usually detected at the failure diagnosis executed at the time of the start-up of the internal combustion engine. Then, it is rare that the diagnosis result changes in the failure diagnoses executed repeatedly.

Therefore, in many cases, in the series of the failure diagnosis processes, the diagnosis results are the same. Therefore, the newer data is written over the older data representing the same result of the newer data in the temporary storage memory, or the writing of the data showing the diagnostic result is not executed. The substantive new data is not written in the temporary storage memory.

The diagnosis result of the failure diagnosis has the above mentioned feature. Thus, if the technology according to the present disclosure is adopted, an appropriate backup operation can be executed when the failure of the vehicle occurs to thereby necessitate the data backup. It is therefore unnecessary to carry out useless backup operations. While reducing the possibility to failing in backing up, the diagnosis associated data can be efficiently backed up.

Further, a threshold setting portion may be configured to set the threshold value according to an outside air temperature based on a measurement result of an in-vehicle temperature sensor which measures the outside air temperature. Herein, the threshold setting portion may be further configured to set the threshold value to a larger value when the outside air temperature is lower.

With respect to the failure diagnosis of the vehicle, until the temperature of the cooling water of the internal combustion engine rises, various failure diagnoses such as the misfire determination and the anomalies in the thermostat are executed in high frequency. In contrast, after the temperature of the cooling water rises and the internal combustion engine moves to the stable state, only a part of the failure diagnoses are executed periodically.

Incidentally, the temperature rise of the cooling water is dependent on the outside air temperature; thus, as the outside air temperature is lower, the time needed for the temperature rise of the cooling water is longer. The threshold value is thus set as a larger value when the outside air temperature is lower. It can be designed that the execution of the backup of the diagnostic result is prevented until the execution frequency of the failure diagnosis becomes low. The diagnosis associated data can be therefore efficiently backed up.

Further, a prohibition portion may be configured to prohibit an operation of at least one of the measurement portion and the backup portion until a temperature of a cooling water is determined to rise to a predetermined temperature after a start-up of an in-vehicle internal combustion engine, based on a measurement result of a temperature sensor which measures a temperature of a cooling water of the in-vehicle internal combustion engine.

As an optional aspect of the first aspect, the process execution portion may be further configured to repeatedly execute, as the predetermined process, a learning process of a control parameter used for vehicle control and write, as the data which results from the executing, a learnt value of the control parameter, which is calculated by the learning process, in the temporary storage memory. And, the storage target data may be a learnt value of the control parameter.

Further, the process execution portion may be further configured to determine whether a difference is within a predetermined range for every execution of the learning process, the difference being between a learnt value calculated at a present time and a past learnt value stored in the temporary storage memory. When it is determined that the difference is within the predetermined range, the learnt value calculated at the present time is not written in the temporary storage memory. Only when it is determined that the difference is not within the predetermined range, the learnt value calculated at the present time is written over the past learnt value in the temporary storage memory.

There is a case where multiple learnt values are defined as storage targets and a learning process corresponding to each learnt value is executed individually. According to the above configuration of the electronic apparatus, it is not necessary to execute the backup operation of the learnt values each time one of the multiple learnt values is written in the temporary storage memory like the conventional technique. The learnt value can be efficiently backed up at a suitable time point.

In addition, in the conventional technique, the learnt value is backed up when the difference of the learnt value becomes large. In the present optional aspect, when the difference of the learnt value becomes large, the learnt value is recorded on the temporary storage memory; then, when the above-mentioned conditions are satisfied, the backup operation is eventually executed. Therefore, according to the present optional aspect, the learnt value can be backed up efficiently compared with the conventional technique. Thus, the number of times of the backup operation can be reduced.

That is, in the technique of recording the learnt value in the temporary storage memory when the difference of the learnt value becomes large, the time point of the learnt value is recorded in the temporary storage memory varies depending on the travel distance, travel time, etc. The present optional aspect can be applied to such a technique, reducing the backup frequency while efficiently backing up the learnt value at a suitable time point.

As an optional aspect of the first aspect, the measurement portion may include a timer which measures an elapsed time starting from a start-up, and a timer controller which starts the timer when the storage target data is written in the temporary storage memory by the process execution portion. The measurement portion may start the timer when the storage target data is written in the temporary storage memory to thereby measure the non-write time period.

In contrast, there is known a computer or micro-computer having a timer which measures an elapsed time starting from a start-up, and a memory access monitor section configured to generate an interruption request when data write is executed to a predetermined monitor area. The measurement portion of the first aspect of the electronic apparatus can be realized by using such a computer.

Thus, as a second aspect of the disclosure, an electronic apparatus is provide as follows The electronic apparatus comprises: a program storage section configured to store a program; a computer configured to execute a process according to the program stored in the program storage section; a volatile temporary storage memory configured to store data temporarily; and a backup memory configured to store to hold backup data corresponding to data written in the temporary storage memory. The computer is further configured to contain a timer which measures an elapsed time starting from a start-up, and a memory access monitor section configured to generate an interruption request when data write is executed to a predetermined monitor area. The program storage section is further configured to include a program causing the computer to achieve functions of the following portions: a process execution portion configured to execute a predetermined process and write data, which results from the executing, in the temporary storage memory; a setting portion configured to set, as the monitor area for the memory access monitor section, an area in the temporary storage memory, the area storing data which expresses an execution result obtained from an execution of the predetermined process and belongs to the storage target data; a timer control portion configured to start the timer when the interruption request is inputted from the memory access monitor section; and a backup portion configured to write a copy of the storage target data in the backup memory as the backup data when it is determined that the elapsed time reaches a threshold value based on a measurement result of the timer.

According to the above configuration of the electronic apparatus, the backup operation mentioned above is realizable efficiently using the function of the computer.

As an optional aspect of the first or second aspect, the temporary storage memory may be a volatile memory, a power supply to the volatile memory being started when an ON operation to turn ON the electronic apparatus is made, and a power source to the volatile memory being shut down when an OFF operation to turn OFF the electronic apparatus is made. The backup memory may be a volatile memory, a power supply to the volatile memory being continued irrespective of the ON operation and the OFF operation.

Further, in contrast, the backup memory may be a nonvolatile memory, which is electrically data rewritable.

If the present optional aspect is applied to an electronic apparatus having an electrically data rewritable nonvolatile memory as a backup memory, the number of times of the writing to the nonvolatile memory such as a flash memory and EEPROM, which has physical restriction in the number of times of the writing can be lessened while the data can be backed up efficiently and the life of the product can improve.

Further, as other aspects of the disclosure, the technology described in the first aspect or second aspect can be realized as a method for data backup or computer-readable medium comprising instructions including the method.

It will be obvious to those skilled in the art that various changes may be made in the above-described embodiments of the present invention. However, the scope of the present invention should be determined by the following claims.

What is claimed is:

1. An electronic apparatus provided with (i) a volatile temporary storage memory to store data temporarily, (ii) a process execution portion to execute a predetermined process and write data, which results from the executing, in the temporary storage memory, and (iii) a backup memory to store to hold backup data corresponding to the data written in the temporary storage memory, at least part of the data held in the temporary storage memory being predetermined as storage target data, the electronic apparatus comprising:
a backup portion configured to write a copy of the storage target data in the backup memory as the backup data; and
a measurement portion configured to measure a non-write time period which is an elapsed time that elapsed since data associated with the storage target data was previously written in the temporary storage memory,
the backup portion being further configured to write the copy of the storage target data in the backup memory as the backup data when it is determined that the non-write time period reaches a predetermined threshold value based on a measurement result by the measurement portion.

2. The electronic apparatus according to claim 1, further comprising:
a read-out portion configured to read out the backup data stored in the backup memory and write the read backup data in the temporary storage memory when an operation to turn ON the electronic apparatus is made,
wherein:
the process execution portion is further configured to write data, which expresses an execution result obtained from an execution of the predetermined process and belongs to the storage target data, in the temporary storage memory by overwriting data, which expresses a past execution result written in the temporary storage memory by the read-out portion; and
the measurement portion is further configured to measure, as the non-write time period, the elapsed time that elapsed since the storage target data stored in the temporary storage memory was previously changed in the temporary storage memory.

3. The electronic apparatus according to claim 1, wherein:
the storage target data is classified into a plurality of groups;
the measurement portion is further configured to measure, with respect to each of the groups, the non-write time period which is the elapsed time that elapsed since data, which is associated with the storage target data and belongs to the each of the groups, was previously written in the temporary storage memory; and
the backup portion is further configured to, with respect to each of the groups, write a copy of the storage target data, which belongs to the each of the groups, in the backup memory as the backup data on a condition that the non-write time period of the each of the groups exceeds a threshold value.

4. The electronic apparatus according to claim 3, wherein:
the backup portion is further configured to, determine, with respect to the each of the groups, whether the non-write time period of the each of the groups exceeds the threshold value based on information on the threshold value individually defined to the each of the groups.

5. The electronic apparatus according to claim 1, further comprising:
a prohibition portion configured to prohibit an operation of at least one of the measurement portion and the backup portion until a specific process among predetermined processes is completed by the process execution portion.

6. The electronic apparatus according to claim 1, wherein:
the process execution portion executes as the predetermined process a failure diagnosis process to diagnose a presence or absence of a failure in a vehicle; and
the storage target data is data representing an execution result of the failure diagnosis process.

7. The electronic apparatus according to claim 6, further comprising:
a threshold setting portion configured to set the threshold value according to an outside air temperature based on a measurement result of an in-vehicle temperature sensor which measures the outside air temperature,
wherein the threshold setting portion is further configured to set the threshold value to a larger value when the outside air temperature is lower.

8. The electronic apparatus according to claim 6, further comprising:
a prohibition portion configured to prohibit an operation of at least one of the measurement portion and the backup portion until a temperature of a cooling water is determined to rise to a predetermined temperature after a start-up of an in-vehicle internal combustion engine, based on a measurement result of a temperature sensor which measures a temperature of a cooling water of the in-vehicle internal combustion engine.

9. The electronic apparatus according to claim 1, wherein:
the process execution portion is further configured to repeatedly execute, as the predetermined process, a learning process of a control parameter used for vehicle control and write, as the data which results from the executing, a learnt value of the control parameter, which is calculated by the learning process, in the temporary storage memory; and
the storage target data is a learnt value of the control parameter.

10. The electronic apparatus according to claim 9 wherein:
the process execution portion is further configured to determine whether a difference is within a predetermined range for every execution of the learning process, the difference being between a learnt value calculated at a present time and a past learnt value stored in the temporary storage memory;
when it is determined that the difference is within the predetermined range, the learnt value calculated at the present time is not written in the temporary storage memory; and
only when it is determined that the difference is not within the predetermined range, the learnt value calculated at the present time is written over the past learnt value in the temporary storage memory.

11. The electronic apparatus according to claim 1, wherein:
the measurement portion includes a timer which measures an elapsed time starting from a start-up, and a timer controller which starts the timer when the storage target data is written in the temporary storage memory by the process execution portion; and
the measurement portion starts the timer when the storage target data is written in the temporary storage memory to thereby measure the non-write time period.

12. An electronic apparatus comprising:
a program storage section configured to store a program;
a computer configured to execute a process according to the program stored in the program storage section;
a volatile temporary storage memory configured to store data temporarily; and
a backup memory configured to store to hold backup data corresponding to data written in the temporary storage memory,
the computer being further configured to contain
a timer which measures an elapsed time starting from a start-up, and
a memory access monitor section configured to generate an interruption request when data write is executed to a predetermined monitor area,
the program storage section being further configured to include a program causing the computer to achieve functions of the following portions:
a process execution portion configured to execute a predetermined process and write data, which results from the executing, in the temporary storage memory;
a setting portion configured to set, as the monitor area for the memory access monitor section, an area in the temporary storage memory, the area storing data which expresses an execution result obtained from an execution of the predetermined process and belongs to the storage target data;
a timer control portion configured to start the timer when the interruption request is inputted from the memory access monitor section; and
a backup portion configured to write a copy of the storage target data in the backup memory as the backup data when it is determined that the elapsed time reaches a threshold value based on a measurement result of the timer.

13. The electronic apparatus according to claim 1, wherein:
the temporary storage memory is a volatile memory, a power supply to the volatile memory being started when an ON operation to turn ON the electronic apparatus is made, and a power source to the volatile memory being shut down when an OFF operation to turn OFF the electronic apparatus is made; and
the backup memory is a volatile memory, a power supply to the volatile memory being continued irrespective of the ON operation and the OFF operation.

14. The electronic apparatus according to claim 1, wherein the backup memory is a nonvolatile memory, which is electrically data rewritable.

* * * * *